United States Patent [19]

Inoue et al.

[11] Patent Number: 5,757,066
[45] Date of Patent: May 26, 1998

[54] RESIN-MOLDED TYPE SEMICONDUCTOR DEVICE AND METHOD OF MANUFACTURING THE SAME

[75] Inventors: Yumi Inoue, Yokohama; Tsutomu Nakazawa, Koriyama, both of Japan

[73] Assignee: Kabushiki Kaisha Toshiba, Kawasaki, Japan

[21] Appl. No.: 621,357

[22] Filed: Mar. 25, 1996

[30]     Foreign Application Priority Data

Mar. 27, 1995 [JP] Japan .................................. 7-092002

[51] Int. Cl.⁶ ................................................ H01L 23/495
[52] U.S. Cl. ........................... 257/666; 257/666; 257/787
[58] Field of Search ...................................... 257/666, 676, 257/674, 673, 787, 735

[56]     References Cited

U.S. PATENT DOCUMENTS 5,635,756  6/1997  Kohno et al. ........................ 257/787

*Primary Examiner*—Mahshid D. Saadat
*Assistant Examiner*—S. V. Clark
*Attorney, Agent, or Firm*—Finnegan, Henderson, Farabow, Garrett & Dunner, L.L.P.

[57]     ABSTRACT

A resin sealed semiconductor device, wherein support pins uphold a pair of facing sides of the semiconductor chip. A projected portion is formed on the distal end portion of the support pin in proximate to the semiconductor chip. The projected portion is formed on both sides of the supporting members which respectively correspond to an upper side and a bottom side of the semiconductor chip in such a manner that when the projected portions are viewed from the upper side or bottom side of the semiconductor chip, they overlap with each other. All of the height of the projected portions are the same. The thickness of the resins formed on both opposite sides of the semiconductor chip is the same with each other, thus preventing the upward or downward displacement within the sealing resin of the semiconductor chip in a thin package.

27 Claims, 30 Drawing Sheets

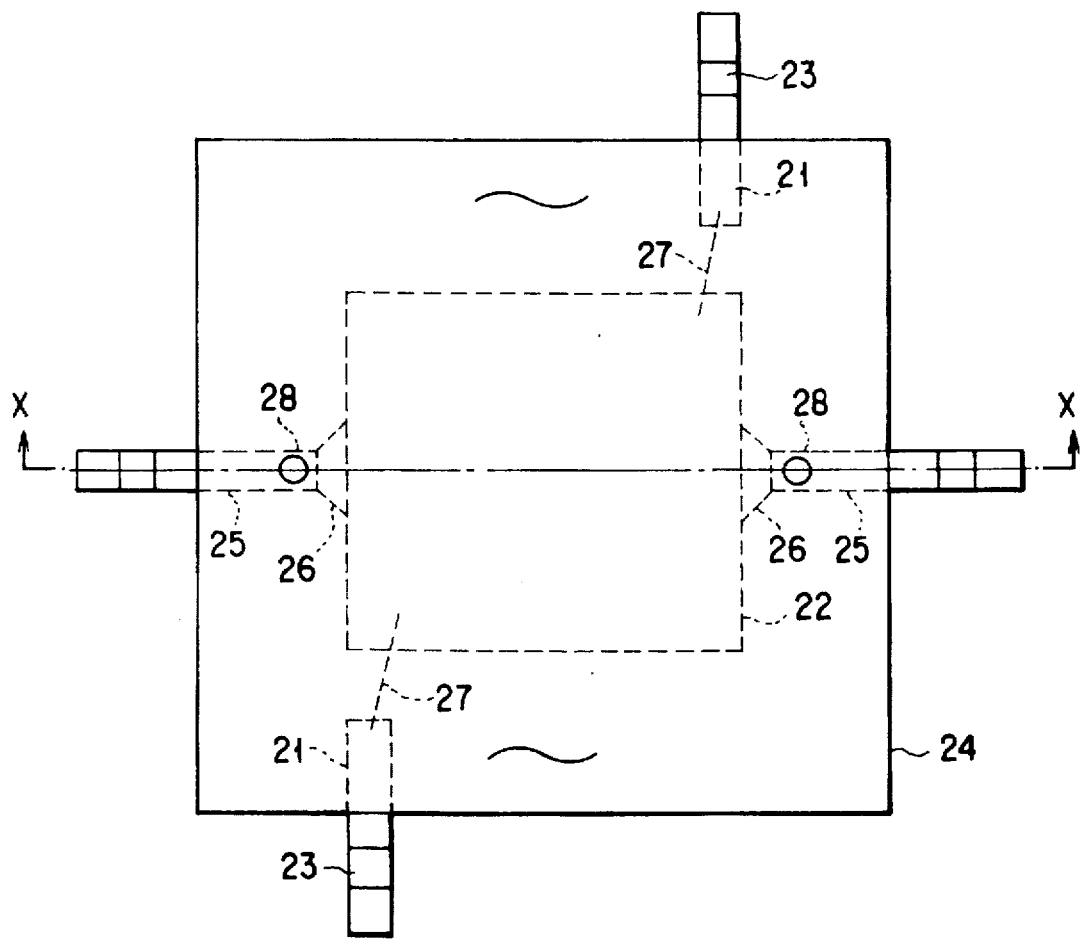
F I G. 9

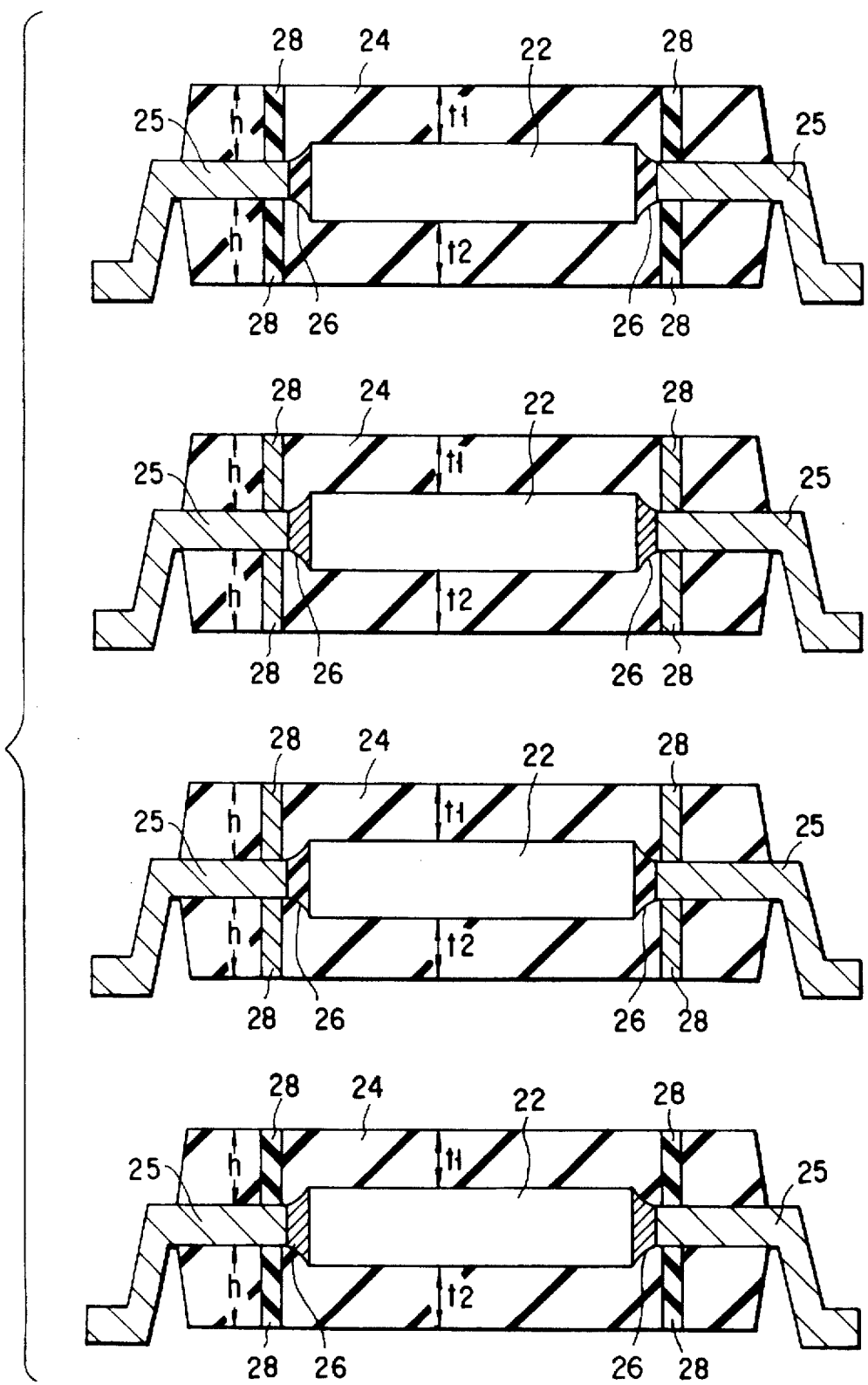
F I G. 10

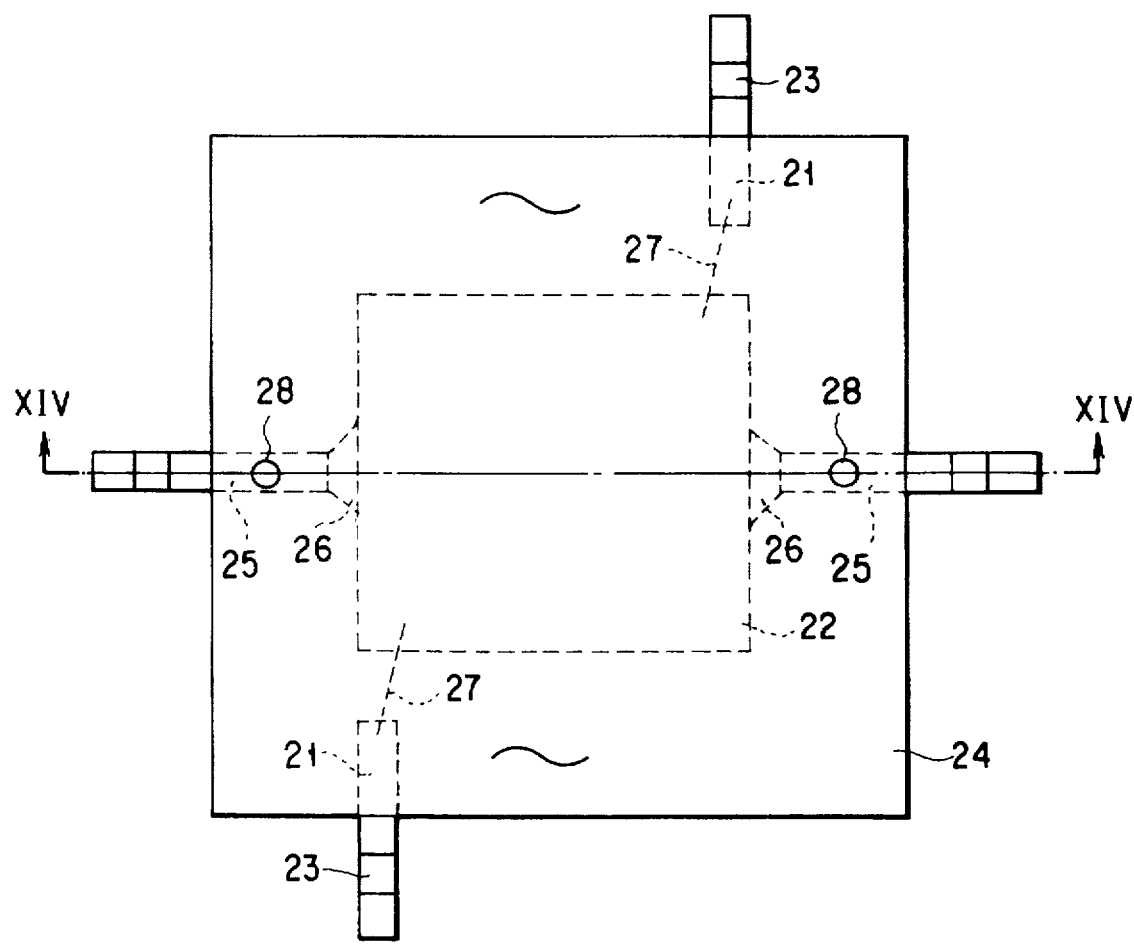
F I G. 13
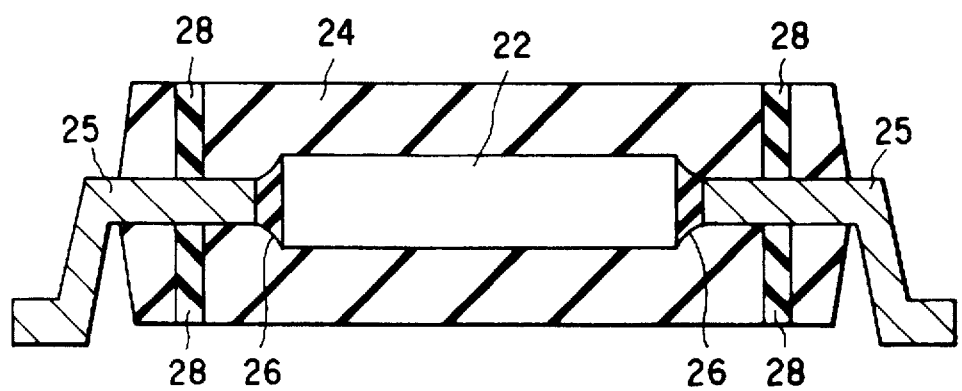
F I G. 14

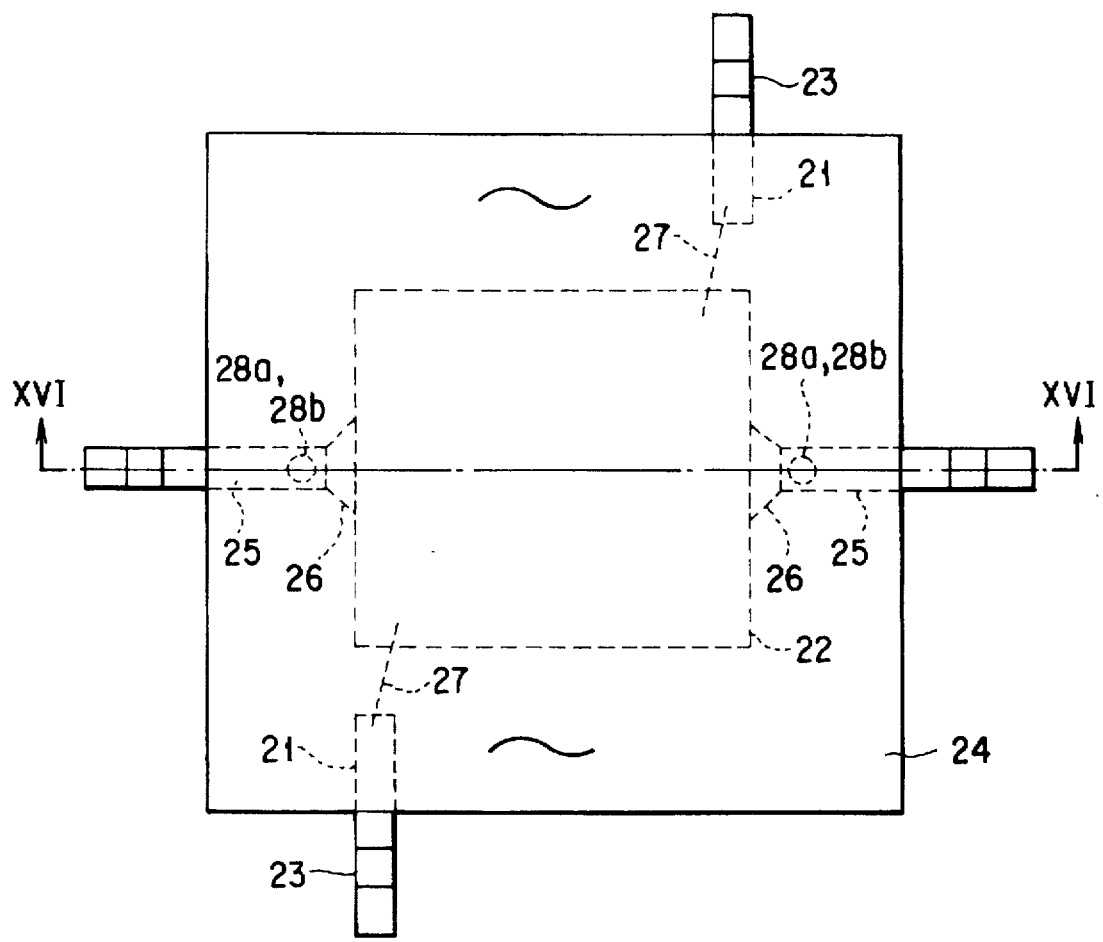
F I G. 15
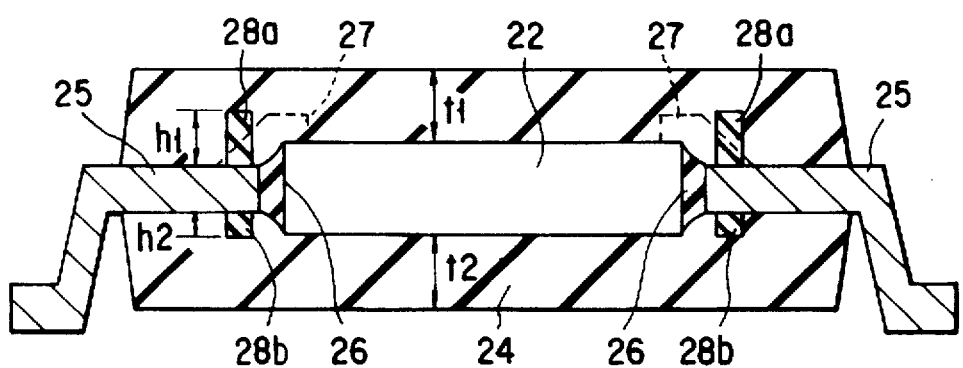
F I G. 16

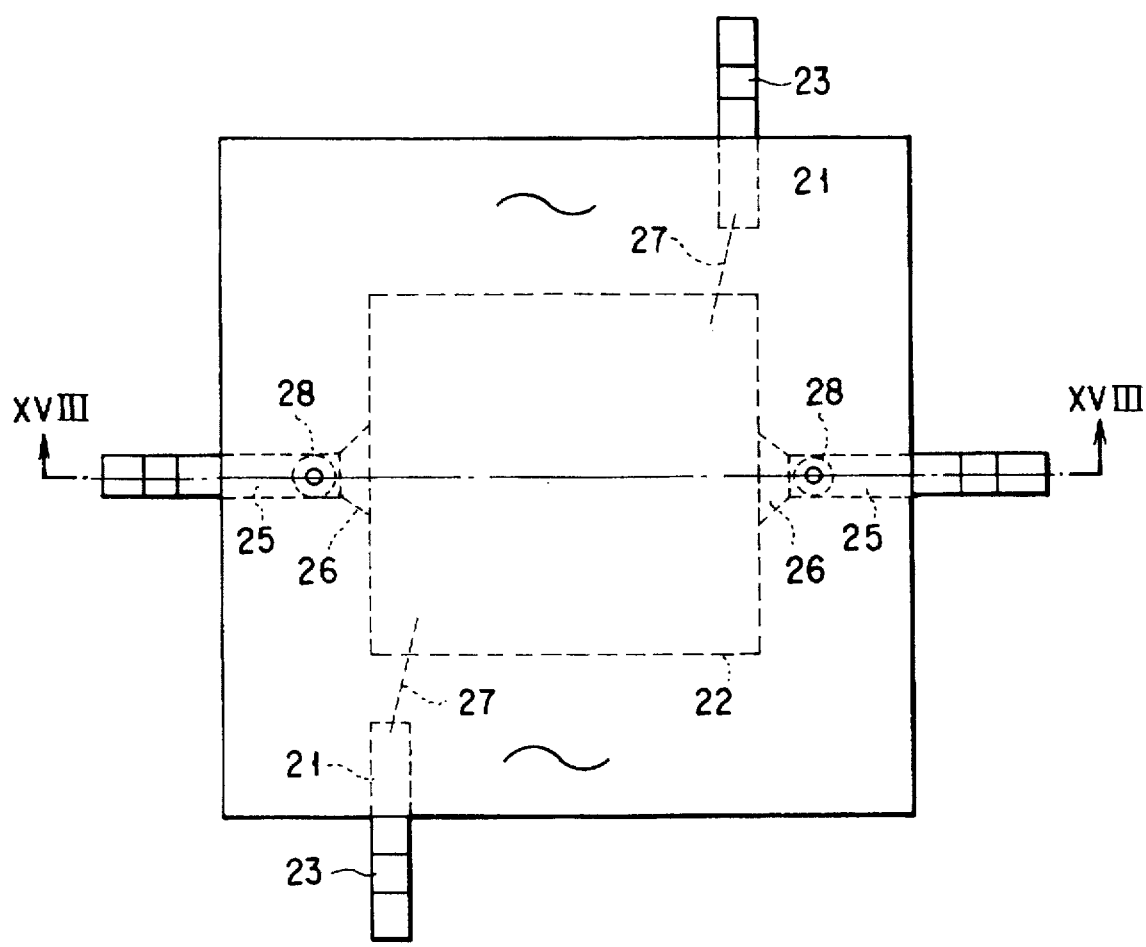
F I G. 17
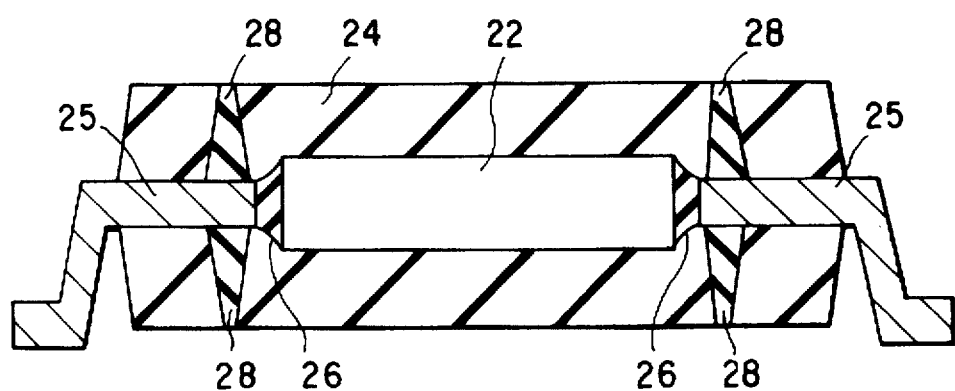
F I G. 18

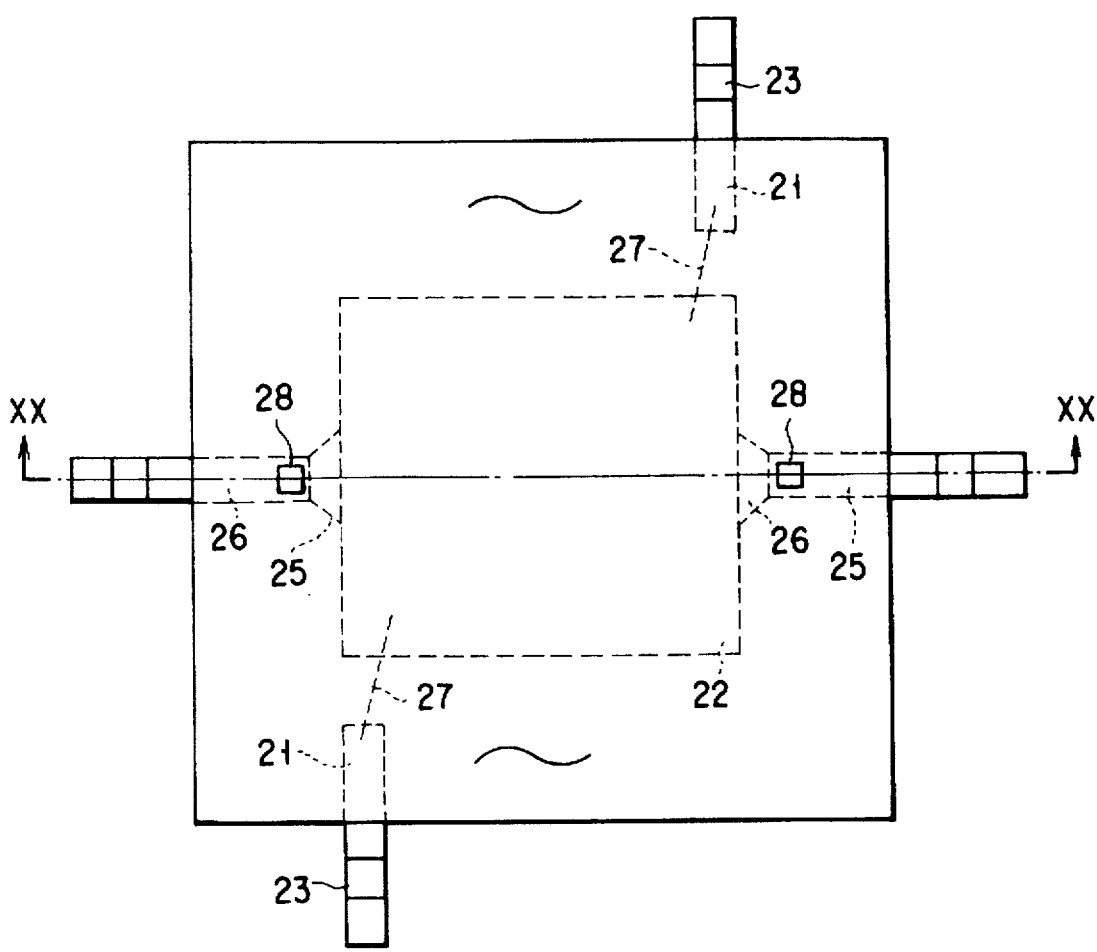
F I G. 19
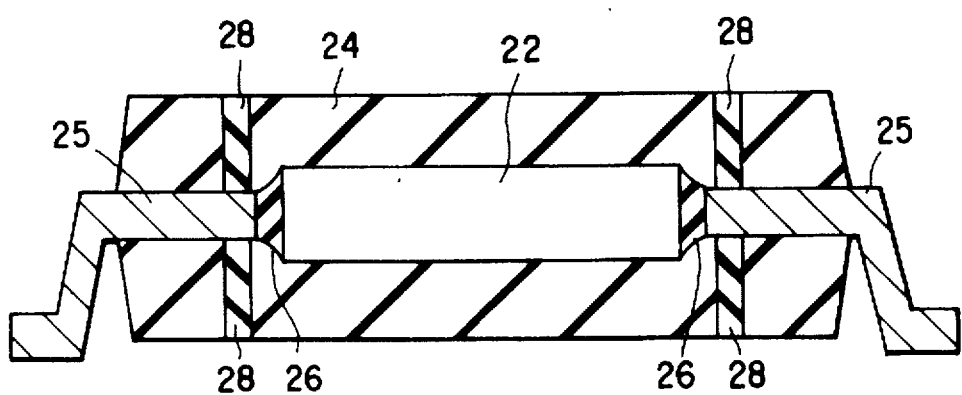
F I G. 20

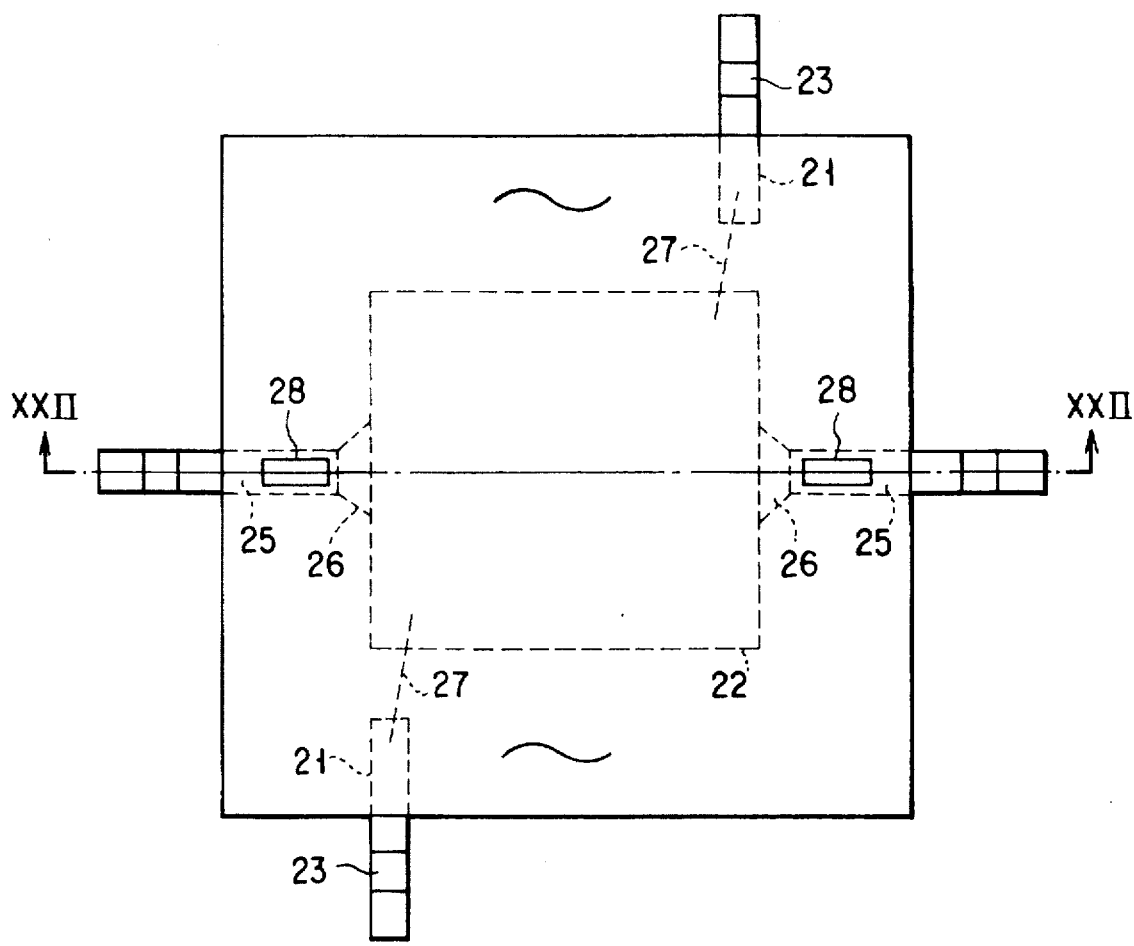
F I G. 21
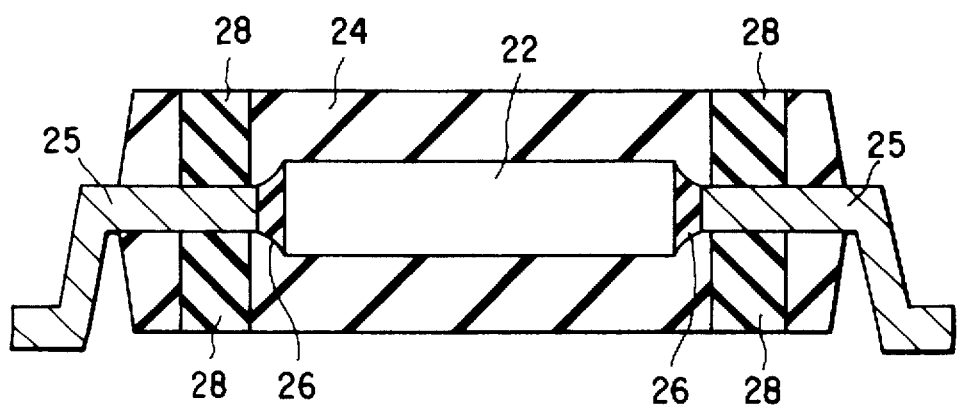
F I G. 22

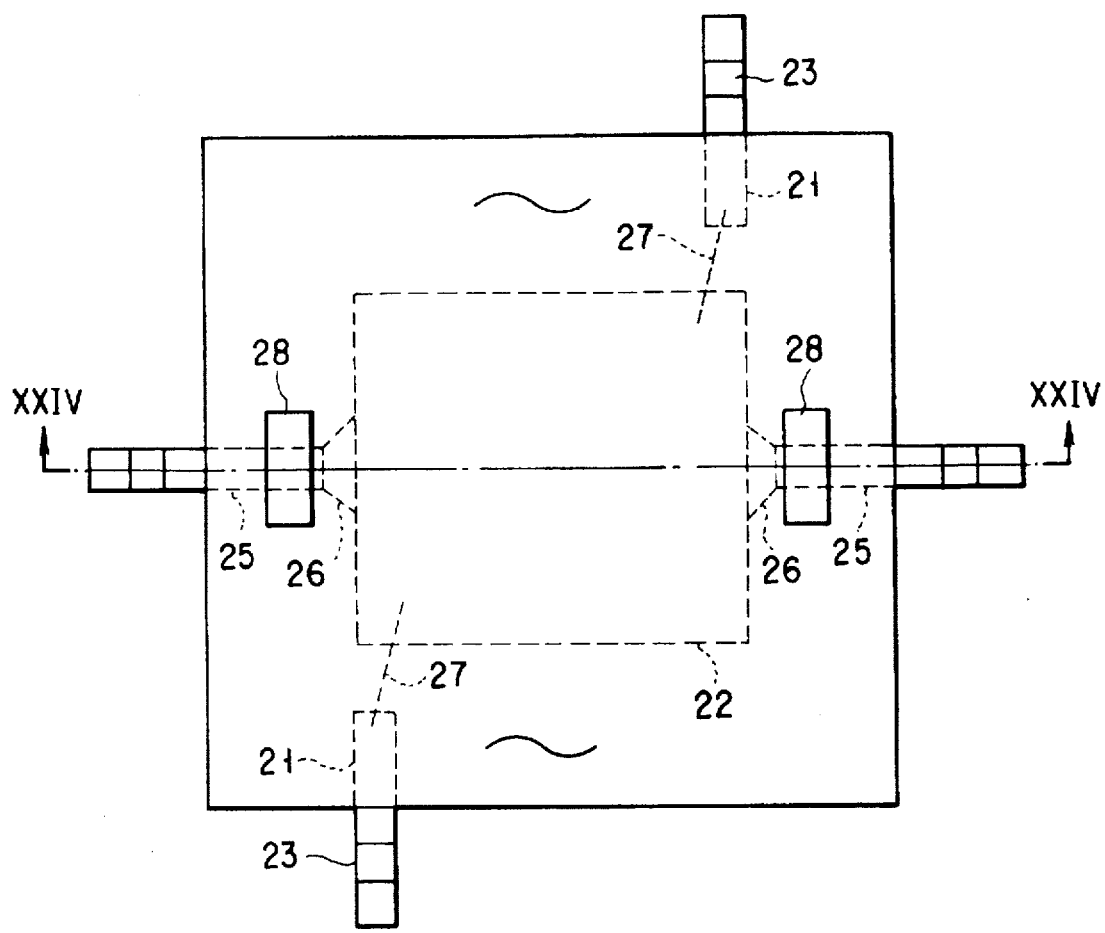
F I G. 23
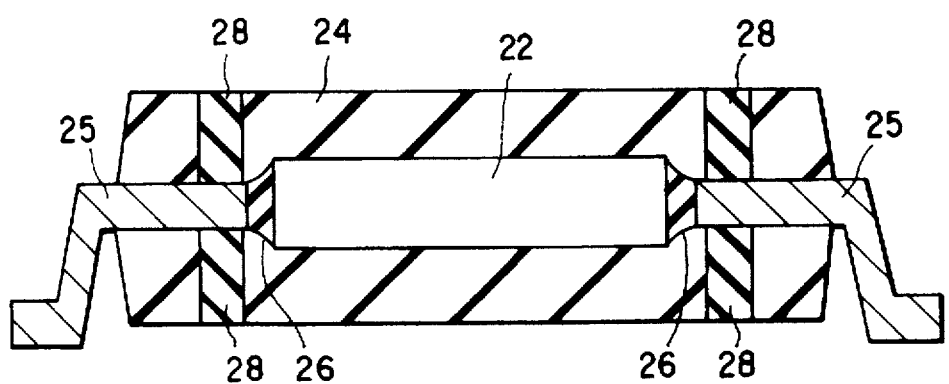
F I G. 24

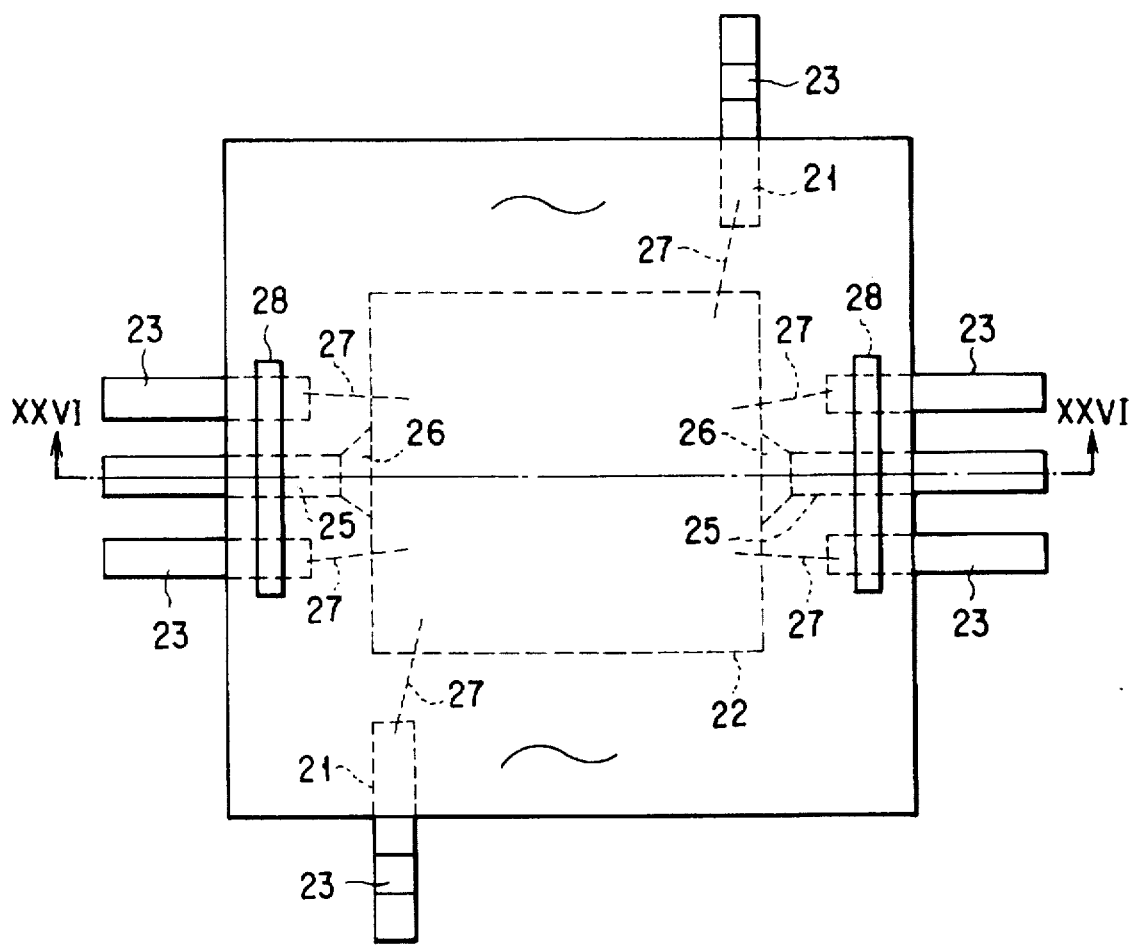
F I G. 25
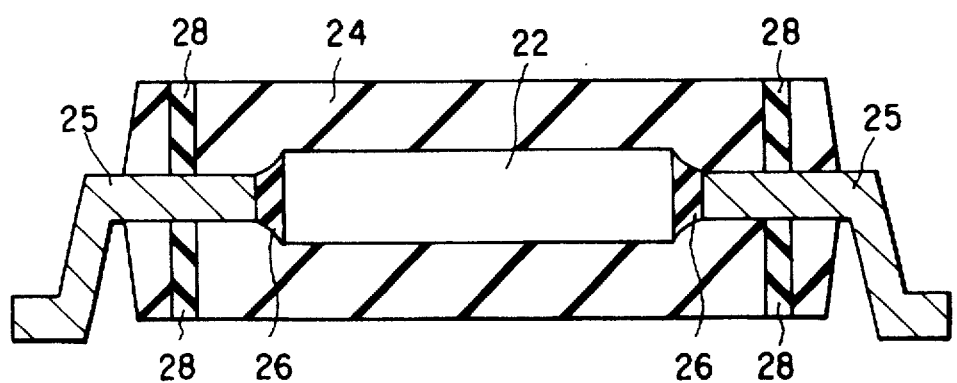
F I G. 26

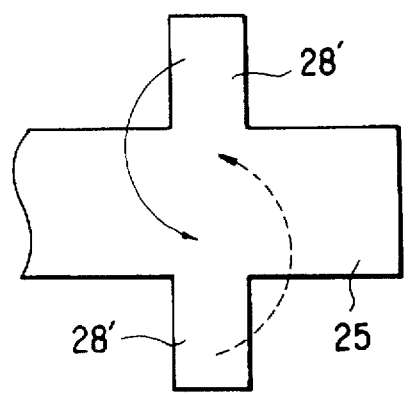
F I G. 27
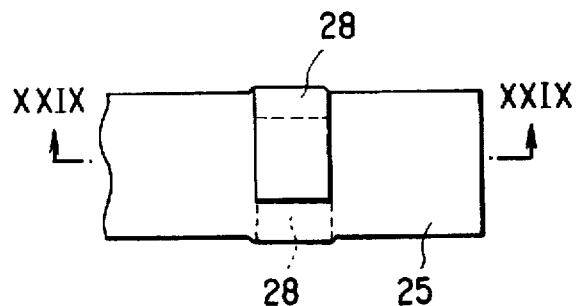
F I G. 28
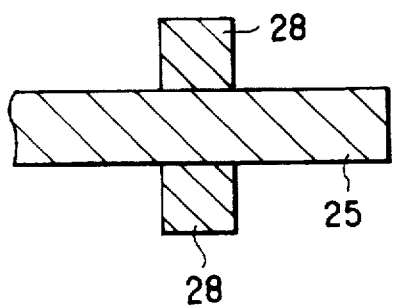
F I G. 29
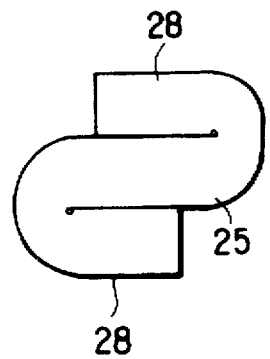
F I G. 30

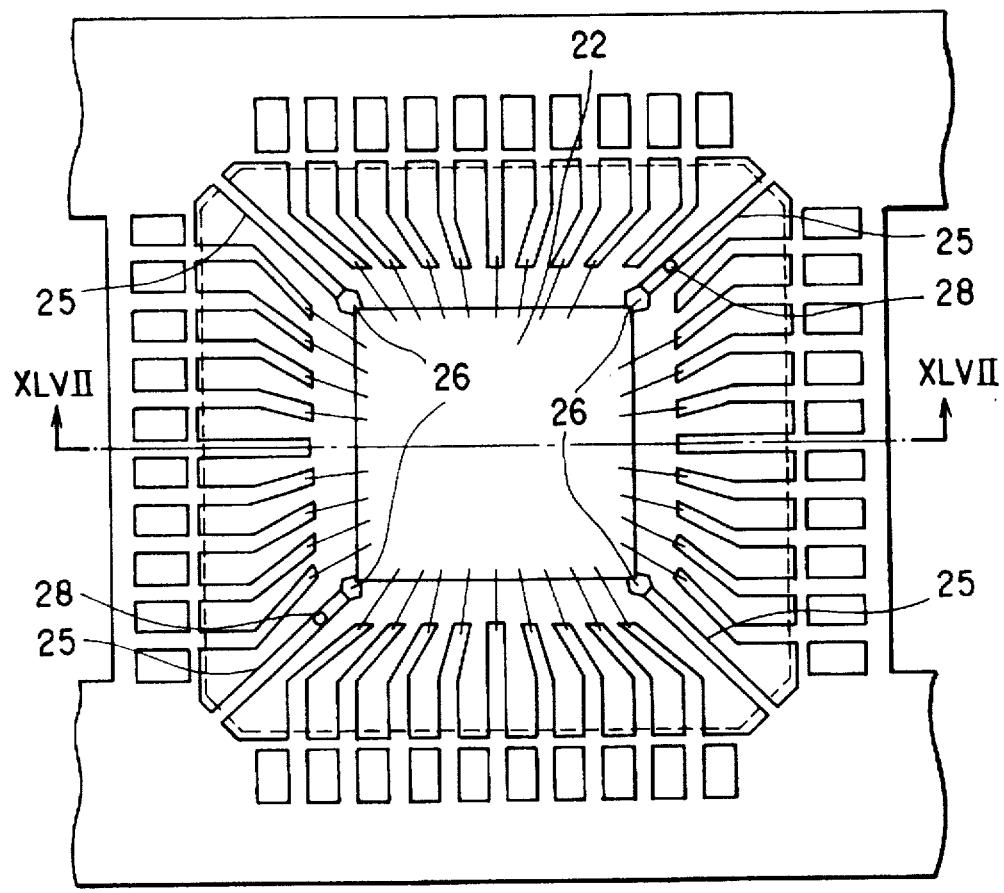
F I G. 46
F I G. 47

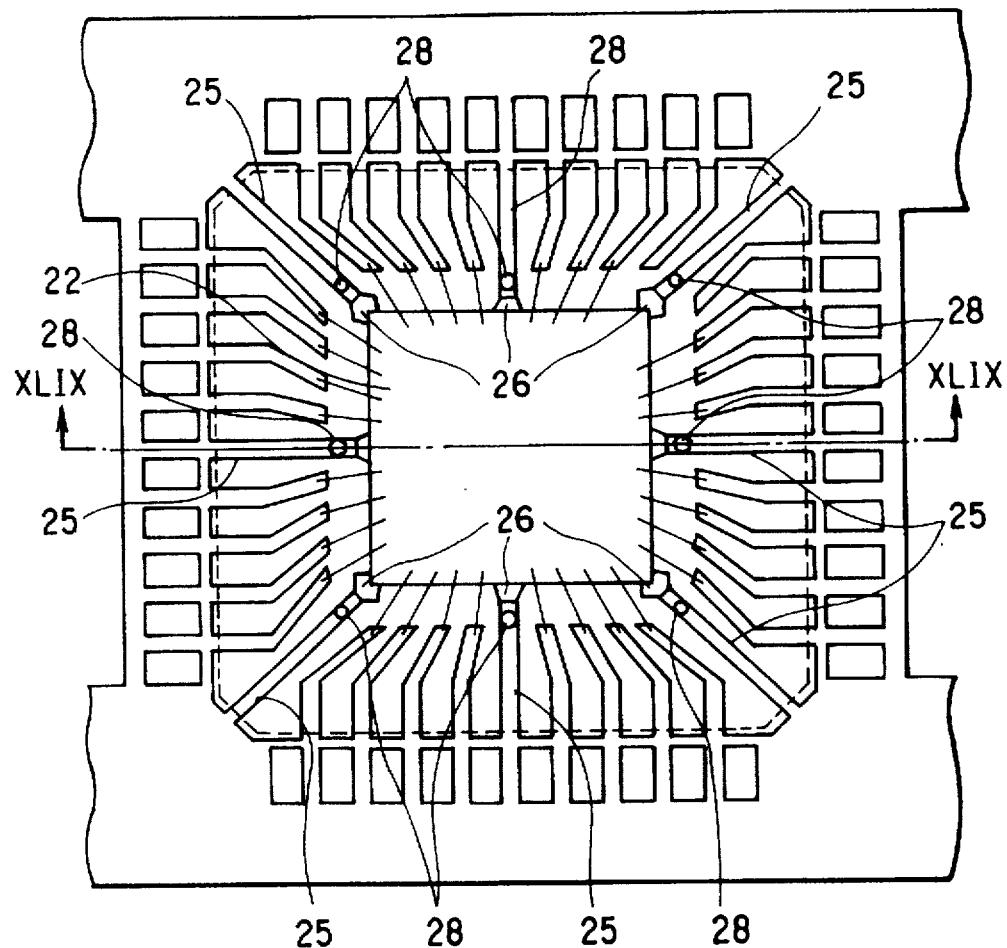
F I G. 48
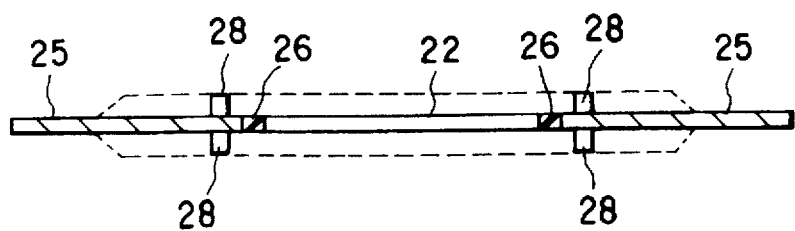
F I G. 49

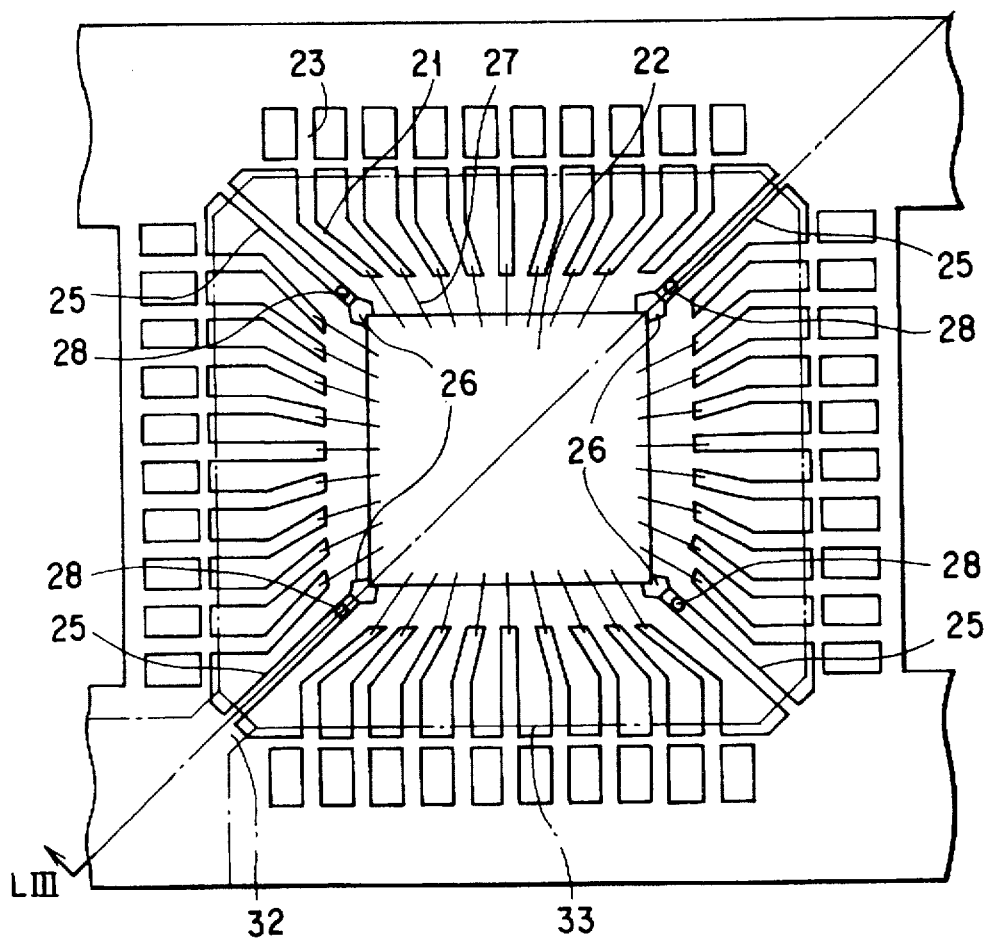
F I G. 52
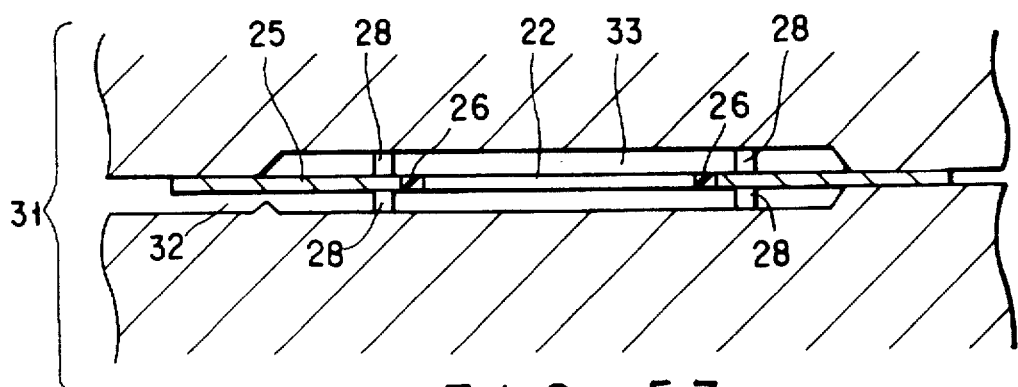
F I G. 53

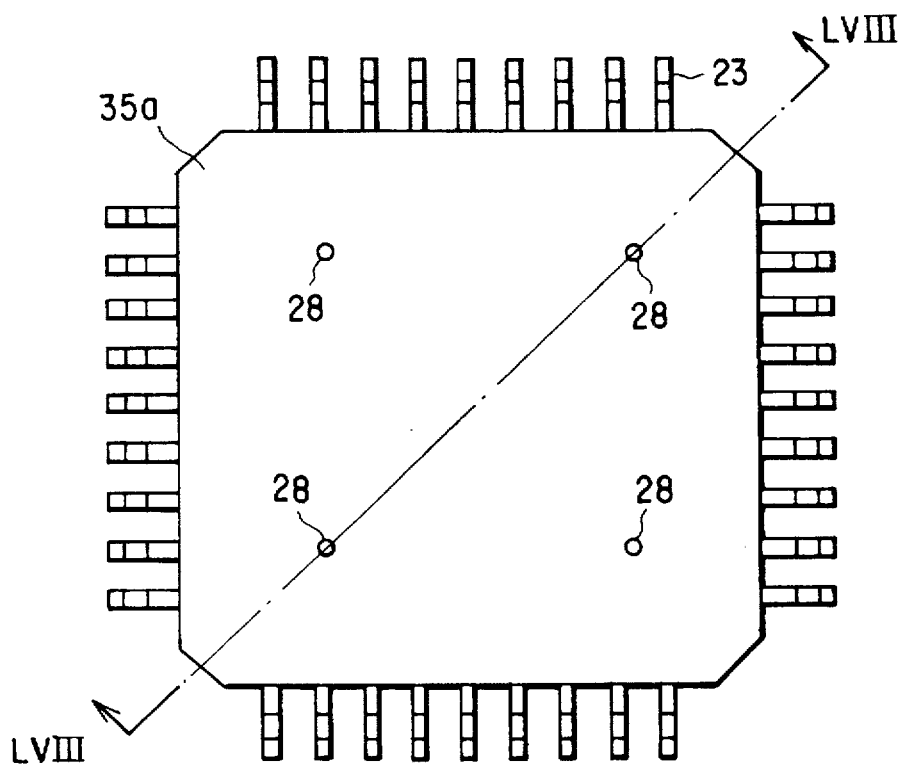
F I G. 57
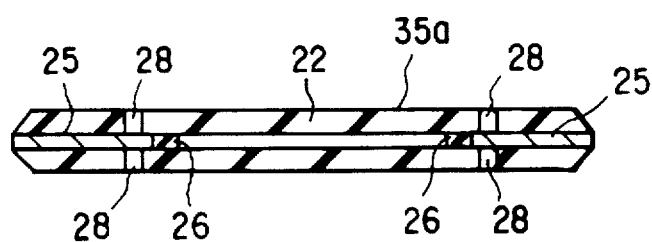
F I G. 58

RESIN-MOLDED TYPE SEMICONDUCTOR DEVICE AND METHOD OF MANUFACTURING THE SAME

BACKGROUND OF THE INVENTION

1. Field of the Invention

This invention relates to a resin-molded type semiconductor device, and to a method of manufacturing the resin-molded type semiconductor device.

2. Description of the Related Art

FIG. 1 shows one example of the conventional resin-molded type semiconductor device illustrating the structure thereof before being sealed with a resin, and FIG. 2 is a cross-sectional view taken on line II—II of FIG. 1.

The lead frame shown in FIG. 1 comprises an outer frame 1, inner leads 2, outer leads 3 and a die pad 4. The semiconductor chip 5 is mounted via an adhesive 6 on the die pad 4. Bonding wire 7 is provided for connecting each inner chip 2 with each of the electrodes of the semiconductor chip 5. The broken line indicates the region to be sealed by a resin.

FIG. 3 shows another example of the conventional resin-molded type semiconductor device illustrating the structure thereof before being sealed with a resin, and FIG. 4 is a cross-sectional view taken on line IV—IV of FIG. 3.

The lead frame shown in FIG. 3 comprises an outer frame 1, inner leads 2, outer leads 3 and a support pin 8. The semiconductor chip 5 is held in place via an adhesive 6 and the support pin 8. Bonding wire 7 is provided for connecting each inner chip 2 with each of the electrodes of the semiconductor chip 5. The broken line indicates the region to be sealed by a resin.

FIG. 5 illustrates a process for sealing a resin-molded type semiconductor device shown in FIGS. 1 or 3 with a resin.

Namely, as shown in FIG. 5(A), the resin-molded type semiconductor device 9 shown in FIGS. 1 or 3 is disposed on a predetermined portion of a heated die 10. Then, as shown in FIG. 5(B), the lead frame of the resin-molded type semiconductor device 9 is fixed with the heated die 10. A resin tablet 11 (see FIG. 5(C)) is charged into the pot 12 of the die 10. Then, as shown in FIG. 5(D), the resin tablet 11 is compressed by way of a plunger 13 thereby causing the resin 11a to flow into a cavity 16 via a runner 14 and a gate 15 from the pot 12. Thereafter, the resin 11a is cured as shown in FIG. 5(E) to obtain an accomplished resin-molded type semiconductor device 17 as shown in FIG. 5(F).

In the case of a transfer mold type semiconductor package as shown in FIGS. 1 and 3 wherein the resin 11a is transferred into the cavity 16 via the runner 14 and gate 15 from the pot 12, various problems such as the bending of the support pin 8 and inner lead 2, the tilting of the semiconductor chip 5 or the deformation of the bonding wire 7 may be caused to arise due to the pressure from the flow of the resin 11a in the cavity 16.

In particular, in the case of a semiconductor device where a semiconductor chip 5 is supported by a support pin 8 as shown in FIG. 3, the bending of the support pin 8 gives a direct influence to the position of the semiconductor chip 5.

Due to this reason, in the case of a semiconductor device where a semiconductor chip 5 is supported by a support pin 8 or in the case of a thin semiconductor device, the bending of the support pin 8 is more likely to become a cause of the occurrence of defective product after the accomplishment thereof.

For example, as shown in FIGS. 7 and 8, when the bending of the support pin 8 or the rotation of a semiconductor chip 5 is caused to occur, the semiconductor chip 5 is often exposed out of the resin 11a. Even if semiconductor chip 5 may not be exposed out of the resin 11a by the bending of the support pin 8 or the rotation of a semiconductor chip 5, the thickness of the resin 11a over the semiconductor chip 5 may become different from the thickness of the resin 11a below the semiconductor chip 5, or the bonding wire 7 may be caused to expose from the resin 11a.

SUMMARY OF THE INVENTION

Accordingly, an object of the present invention is to overcome the aforementioned problems and to provide a resin-molded type semiconductor device to be packed through a transfer molding, which is free from any upward or downward displacement of a semiconductor chip within a sealing resin, thereby to improve the yield of the product.

Namely, according to the present invention, there is provided a resin sealed semiconductor device comprising a semiconductor chip; a plurality of supporting members for supporting the semiconductor chip; a plurality of leads; bonding wires each connecting between an electrode of the semiconductor chip and one end of the lead; a projected portion formed on at least one of the plurality of leads; and a sealing resin covering the semiconductor chip.

The plurality of supporting members are adapted to support at least a pair of facing sides or at least of diagonally opposed corners of the semiconductor chip.

The plurality of supporting members may be formed only within the interior of the resin or formed to protrude out of the resin.

The aforementioned projected portion may be formed at least on the supporting members supporting the facing two sides of the semiconductor chip or at least on the supporting members supporting diagonally opposed two corners of the semiconductor chip.

The aforementioned projected portion may be formed on both sides of the supporting members which respectively correspond to an upper side and a bottom side of the semiconductor chip in such a manner that when aforementioned projected portions are viewed from the upper side or bottom side of the semiconductor chip, they overlap with each other.

The aforementioned projected portion may be formed on both sides of the supporting members which respectively correspond to an upper side and a bottom side of the semiconductor chip in such a manner that at least every projected portions formed on the upper side are of the same height, or at least every projected portions formed on the bottom side of the semiconductor chip are of the same height.

The aforementioned projected portion may be formed on both sides of the supporting members which respectively correspond to an upper side and a bottom side of the semiconductor chip in such a manner that every projected portions formed on the upper side and the bottom side of the semiconductor chip are of the same height, and a thickness of the resin formed on the upper side of the semiconductor chip is the same as a thickness of the resin formed on the bottom side of the semiconductor chip.

The aforementioned projected portion should preferably be disposed at the distal end portion of the supporting member in proximate to the semiconductor chip. In this case, the projected portion may be disposed only within the interior of the resin.

The aforementioned projected portion may be smaller in height than the thickness of the supporting member. The height of the aforementioned projected portion may be smaller than the length or width of the projected portion. This projected portion may be integrally formed with the supporting member.

The present invention also provides a method of manufacturing a resin-molded type semiconductor device which comprises the steps of: preparing a lead frame provided with a supporting member for supporting a semiconductor chip; forming a projected portion on the supporting member; and sealing the lead frame with a resin through a transfer mold after setting the lead frame on a die.

The aforementioned projected portion may be formed on the supporting member before the semiconductor chip is supported by the supporting member, or formed on the supporting member after the semiconductor chip is supported on the supporting member.

The aforementioned projected portion may be formed on the supporting member by bending a projected portion or a cut portion formed in advance in the supporting member.

According to the resin-molded type semiconductor device constructed above, a projected portion is formed on a supporting member for supporting a semiconductor device. Therefore, the bending of the supporting member would not be caused during the resin-sealing through a transfer molding of the semiconductor device so that the semiconductor chip would not be exposed out of the sealing resin even if the thickness of the package is very thin.

Since the plurality of supporting members uphold at least a pair of facing sides or at least of diagonally opposed corners of the semiconductor chip, it is possible to firmly fix the semiconductor chip in place. The plurality of supporting members most preferably should be disposed to support four sides or four corners. The larger the number of the supporting member, the less the tilting of the semiconductor chip.

When the supporting member is extruded out of the sealing resin, the supporting member can be utilized as a terminal of power source.

When a projected portion is formed on each of the supporting members upholding at least a pair of facing sides or at least of diagonally opposed corners of the semiconductor chip, it is possible to minimize the upward or downward displacement within the sealing resin of the semiconductor chip. The projections may be disposed on all of the supporting members.

The aforementioned projected portions formed on the upper side of the semiconductor chip and on the bottom side of the semiconductor chip overlap with each other when viewed from both sides, the bending of the supporting member can be minimized.

When the heights of the aforementioned projected portions are the same with each other, thickness of the resin formed on the upper side of the semiconductor chip becomes the same as the thickness of the resin formed on the bottom side of the semiconductor chip, thus preventing the package from being curved.

When the aforementioned projected portion is disposed at the distal end portion of the supporting member in proximate to the semiconductor chip, it is possible to minimize the upward or downward displacement within the sealing resin of the semiconductor chip.

When the aforementioned projected portion is smaller in height than the thickness of the supporting member, or the height of the aforementioned projected portion is smaller than the length or width of the projected portion, the strength of the projected portion becomes maximum, thereby preventing the projected portion from being fractured.

When the aforementioned projected portion is integrally formed with the supporting member, the fracture of the projected portion can be prevented and at the same time the projected portion can be easily formed.

According to the method of manufacturing a resin-molded type semiconductor device, the sealing of the lead frame through a transfer mold is performed after the formation of the projected portion on the supporting member for upholding a semiconductor chip. Therefore, the bending of the supporting member during the sealing of the lead frame with a resin would not be caused, so that the semiconductor chip would not be exposed out of the sealing resin even if the thickness of the package is very thin.

When the aforementioned projected portion is formed on the supporting member by bending a projected portion or a cut portion formed in advance in the supporting member, the projected portion can be easily formed with the manufacturing cost thereof being saved.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 9 is a plan view showing the resin-molded type semiconductor device according to a first embodiment of this invention;

FIG. 10 is a cross-sectional view taken on line X—X of FIG. 9;

FIG. 13 is a plan view showing the resin-molded type semiconductor device according to a third embodiment of this invention;

FIG. 14 is a cross-sectional view taken on line XIV—XIV of FIG. 13;

FIG. 15 is a plan view showing the resin-molded type semiconductor device according to a fourth embodiment of this invention;

FIG. 16 is a cross-sectional view taken on line XVI—XVI of FIG. 15;

FIG. 17 is a plan view showing the resin-molded type semiconductor device according to a fifth embodiment of this invention;

FIG. 18 is a cross-sectional view taken on line XVIII—XVIII of FIG. 17;

FIG. 19 is a plan view showing the resin-molded type semiconductor device according to a sixth embodiment of this invention;

FIG. 20 is a cross-sectional view taken on line XX—XX of FIG. 19;

FIG. 21 is a plan view showing the resin-molded type semiconductor device according to a seventh embodiment of this invention;

FIG. 22 is a cross-sectional view taken on line XXII—XXII of FIG. 21;

FIG. 23 is a plan view showing the resin-molded type semiconductor device according to an eighth embodiment of this invention;

FIG. 24 is a cross-sectional view taken on line XXIV—XXIV of FIG. 23;

FIG. 25 is a plan view showing the resin-molded type semiconductor device according to a ninth embodiment of this invention;

FIG. 26 is a cross-sectional view taken on line XXVI—XXVI of FIG. 25;

FIG. 27 is a plan view showing the resin-molded type semiconductor device according to a tenth embodiment of this invention;

FIG. 28 is a plan view showing the resin-molded type semiconductor device according to a tenth embodiment of this invention;

FIG. 29 is a cross-sectional view taken on line XXIX—XXIX of FIG. 28;

FIG. 30 is a front view showing the resin-molded type semiconductor device according to a tenth embodiment of this invention;

FIG. 46 is a plan view showing the resin-molded type semiconductor device according to an eighteenth embodiment of this invention;

FIG. 47 is a cross-sectional view taken on line XLVII—XLVII of FIG. 46;

FIG. 48 is a plan view showing the resin-molded type semiconductor device according to a nineteenth embodiment of this invention;

FIG. 49 is a cross-sectional view taken on line XLIX—XLIX of FIG. 48;

FIG. 52 is a plan view showing a manufacturing step of the resin-molded type semiconductor device of this invention;

FIG. 53 is a cross-sectional view taken on line LIII—LIII of FIG. 52;

FIG. 57 is a plan view showing a manufacturing step of the resin-molded type semiconductor device of this invention; and FIG. 58 is a cross-sectional view taken on line LVIII—LVIII of FIG. 57.

DETAILED DESCRIPTION OF THE PREFERRED EMBODIMENTS

Figure 1:
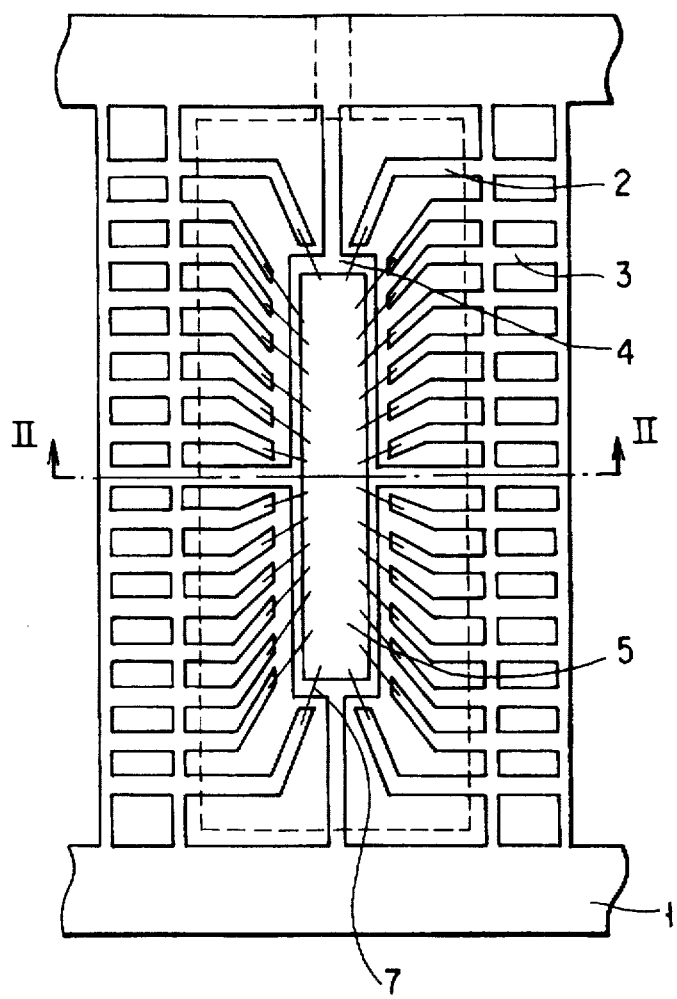
FIG. 1 is a plan view showing one example of the conventional resin-molded type semiconductor device.
Figure 2:
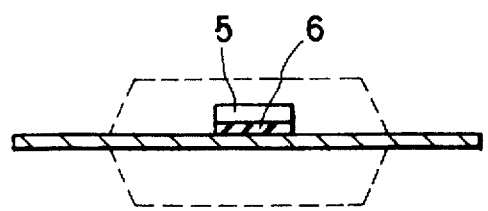
FIG. 2 is a cross-sectional view taken on line II—II of FIG. 1.
Figure 3:
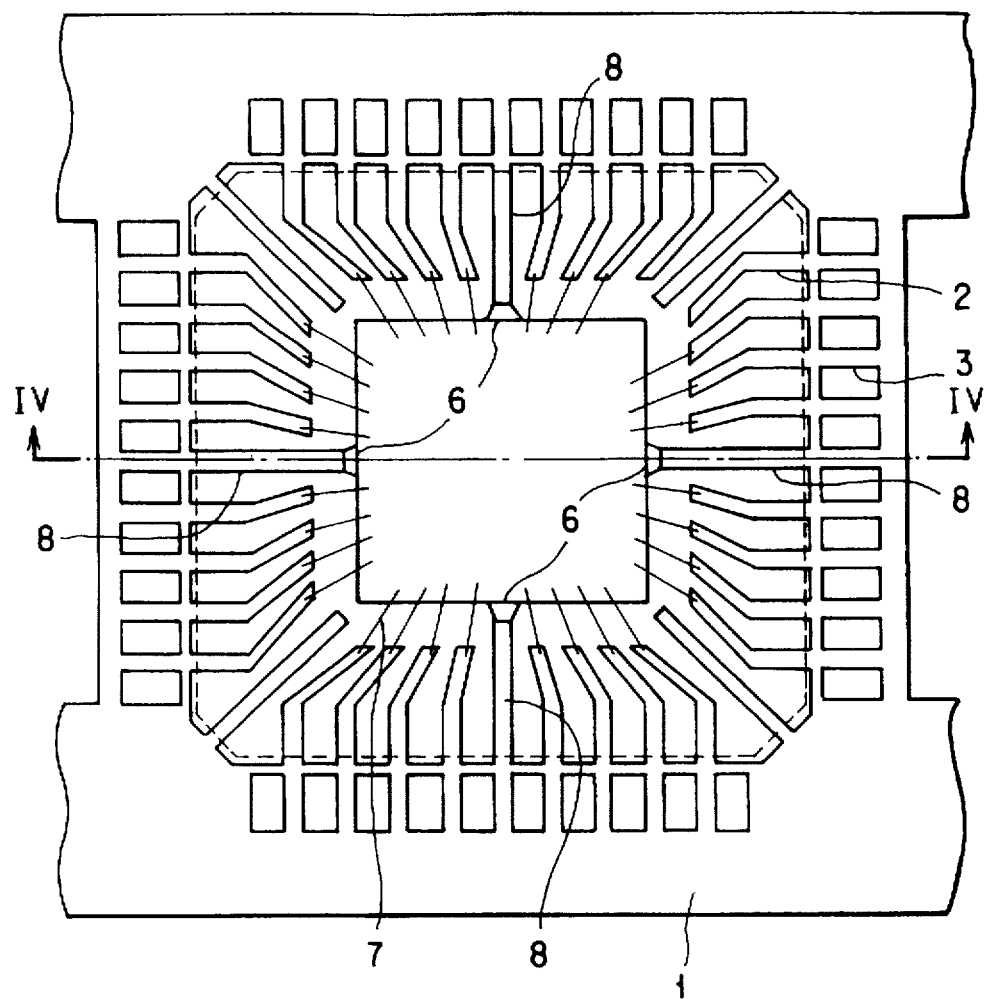
FIG. 3 is a plan view showing another example of the conventional resin-molded type semiconductor device.
Figure 4:
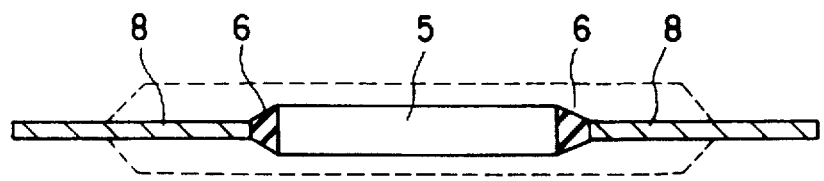
FIG. 4 is a cross-sectional view taken on line IV—IV of FIG. 3.
Figure 5:
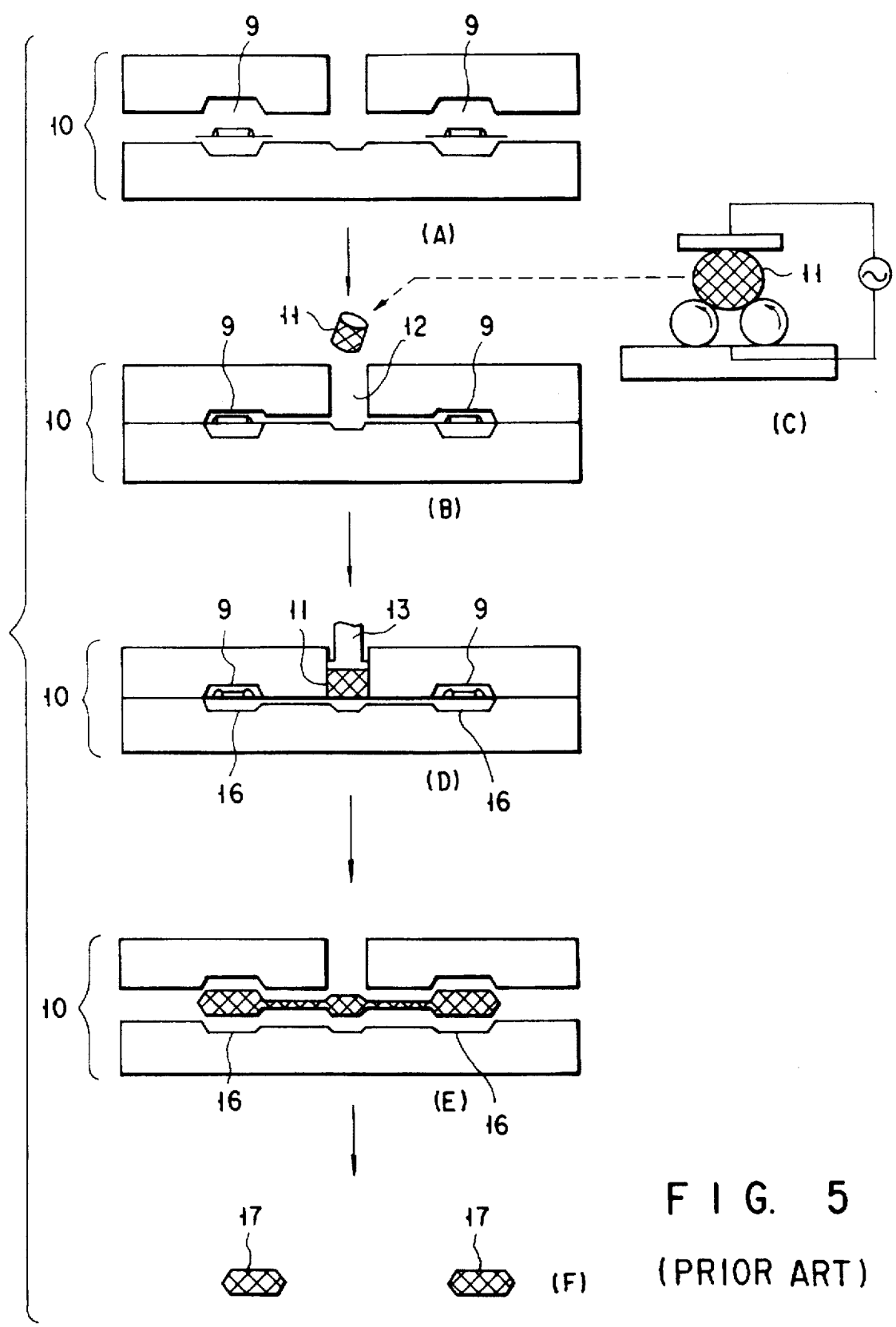
FIGS. 5(a-e) is a cross-sectional view illustrating the manufacturing steps of the conventional resin-molded type semiconductor device; M
Figure 6:
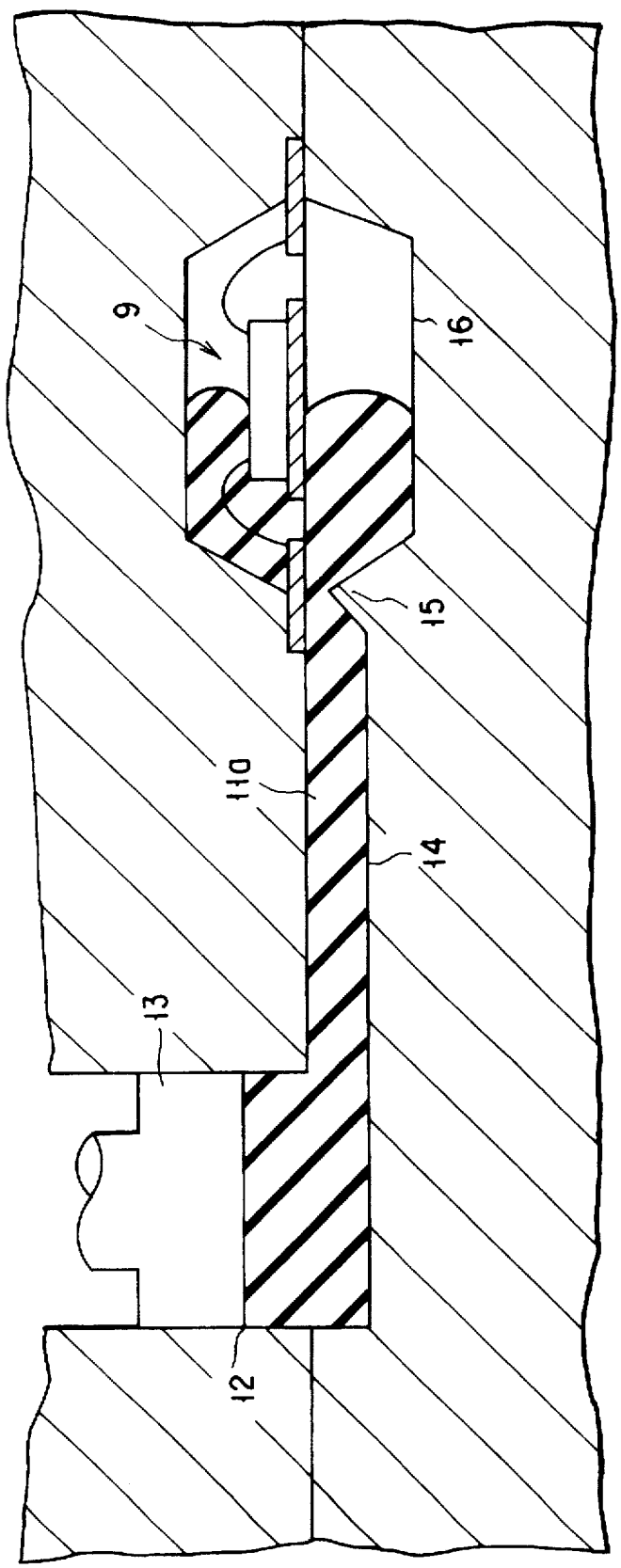
FIG. 6 is a cross-sectional view illustrating a manufacturing step of the conventional resin-molded type semiconductor device.
Figure 7:
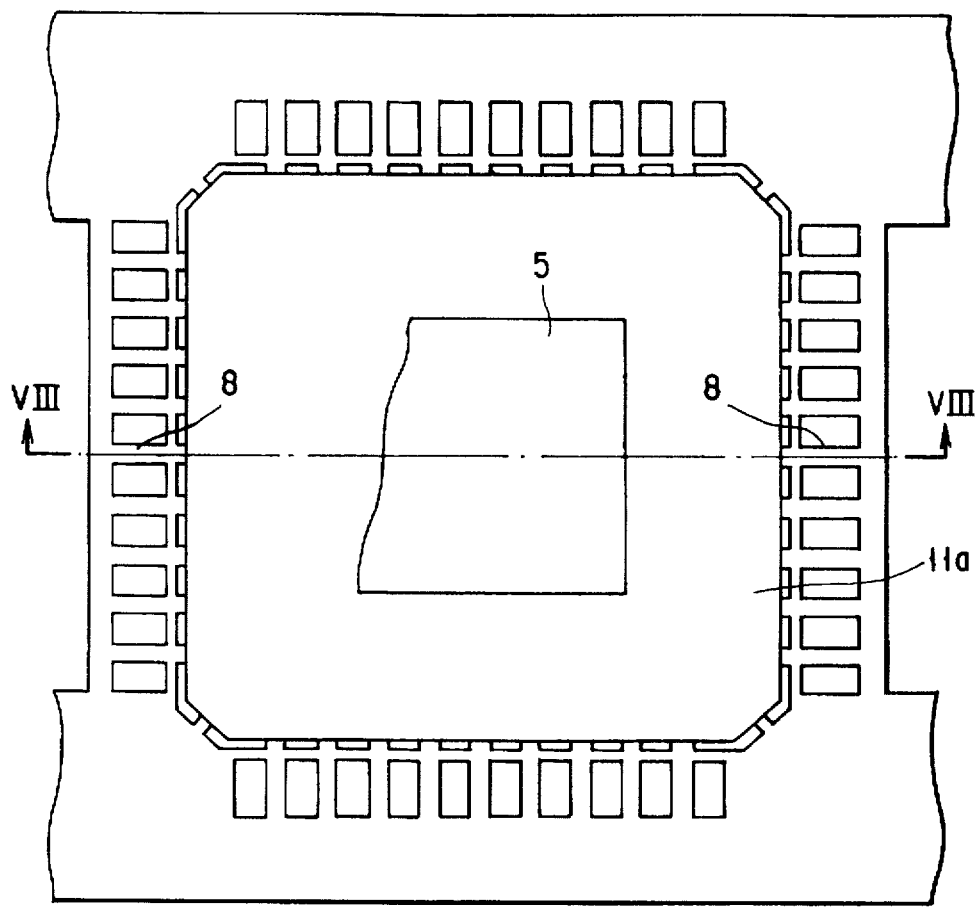
FIG. 7 is a plan view showing conventional resin-molded type semiconductor device.
Figure 8:
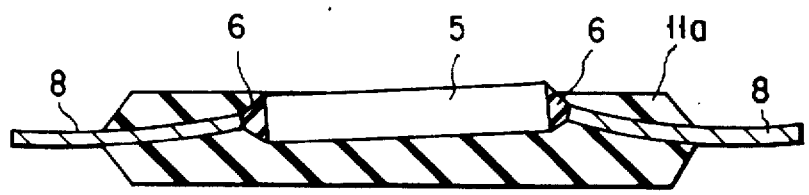
FIG. 8 is a cross-sectional view taken on line VII—VII of FIG. 7.

The resin-molded type semiconductor device of this invention as well as the method of manufacturing the resin-molded type semiconductor device according to this invention will be further explained with reference to the drawings.

This invention is applicable in particular to a very thin semiconductor device such as a memory card where a semiconductor chip may be caused to be easily exposed out of a sealing resin due to an tilting, even if it is minute, of the semiconductor chip, or to a semiconductor device where a semiconductor chip is upheld by a support pin which is most vulnerable to the influence from a sealing-resin flow.

In the following examples, this invention will be explained mainly with reference to a semiconductor device where a semiconductor chip is supported or upheld by a support pin.

FIG. 9 shows the resin-molded type semiconductor device according to a first embodiment of this invention and FIG. 10 shows a cross-sectional view taken on line X—X of FIG. 9.

Referring to FIGS. 9 and 10, a plurality of inner leads 21 are disposed around a semiconductor chip 22. A plurality of outer leads 23 are exposed from a sealing resin 24 and immediately bent downward (or toward the back surface side of the semiconductor chip 22).

A support pin 25 is disposed at several places (at least two places) among a plurality of the inner leads 21. An adhesive 26 is applied between the distal end portion of the support pin 25 and the peripheral portion of the semiconductor chip 22 so as to fix the semiconductor chip 22 in place. A bonding wire 27 is disposed to effect a connection between each of the inner lead 21 and each corresponding electrode of the semiconductor chip 22. The support pin 25 is exposed from the sealing resin 24 and immediately bent downward (or toward the back surface side of the semiconductor chip 22).

A pair of projected portions 28 are disposed at the distal end portion of at least one of the support pins 25 in proximate to the semiconductor chip 22 so as to extend upward (the upper surface side of the semiconductor chip 22) and downward (the back surface side of the semiconductor chip 22) from the distal end portion of the support pin 25. The pair of the projected portions 28 disposed on both sides of the distal end portion of the support pin 25 are positioned so as to overlap with each other as viewed from the upper side or bottom side of the semiconductor chip 22.

The height RhS of each projected portion 28 is the same with each other. The surface of the projected portion 28 exposed out of the resin 24 is flush with the surface of the resin 24. In this case, the thickness Rt1S of the resin 24 on the upper surface of the semiconductor chip 22 is equal to the thickness Rt2S of the resin 24 on the back surface of the semiconductor chip 22.

The adhesive 26 may be formed of either an insulating material or a conductive material. The projected portions 28 may also be formed of either an insulating material or a conductive material.

According to the drawings of the first example, four kinds of combination comprising the characteristics (conductivity and insulating property) of the adhesive 26 and the characteristics (conductivity and insulating property) of the projected portion are all indicated. However, in the drawings representing the following examples beginning from the second example, a combination where the adhesive 26 and the projected portion. 28 are both formed of an insulating material is shown for the purpose of simplifying the explanation. However, it should be noted that both of the adhesive 26 and the projected portion 28 may be formed of either an insulating material or a conductive material.

If a predetermined potential such as ground potential is to be supplied to the semiconductor chip 22, both of the adhesive 26 and the projected portion 28 should be formed of a conductive material. If the adhesive 26 is formed of an insulating material, the semiconductor chip 22 would not be electrically influenced from the outside of the resin 24.

When the projected portion 28 is formed of a heat-conductive material such as a metal, any heat generating from the semiconductor chip 22 may be effectively diffused out of the sealing resin 24.

The projected portion 28 should preferably be formed of a material which is inferior in strength than that of material constituting a die in order to prevent the abrasion of the die.

Figure 11:
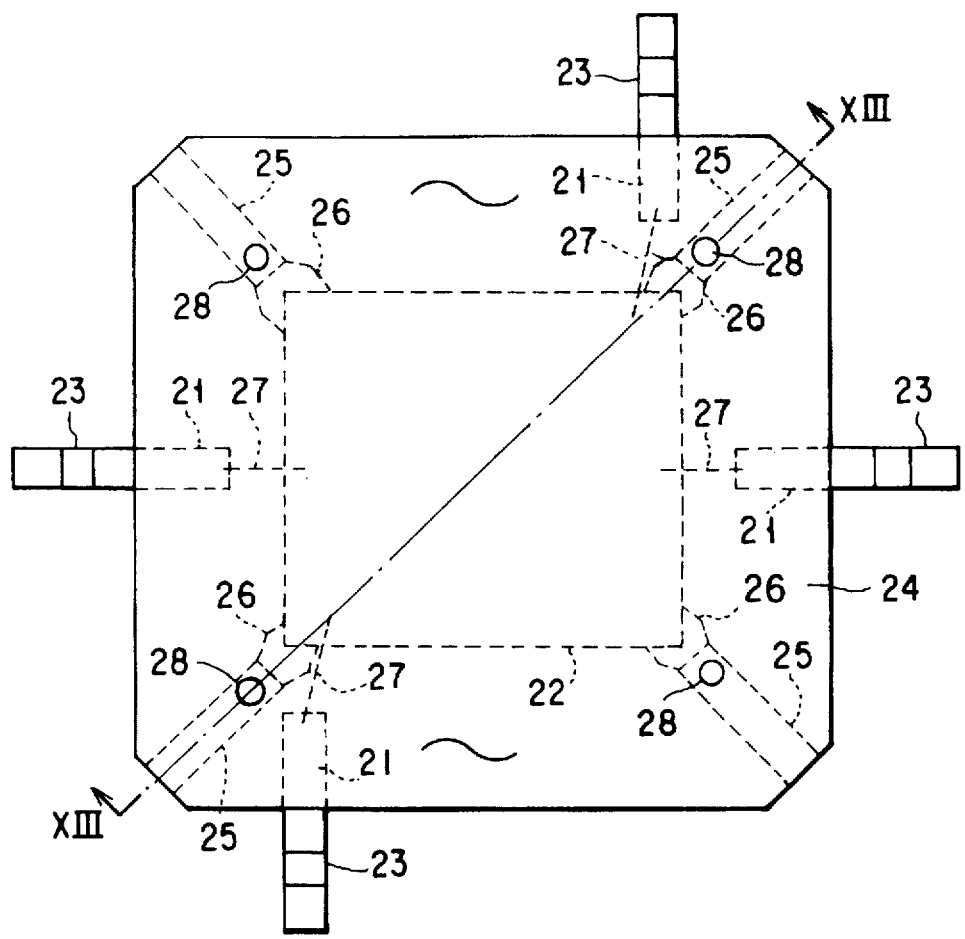
FIG. 11 is a plan view showing the resin-molded type semiconductor device according to a second embodiment of this invention.
Figure 12:
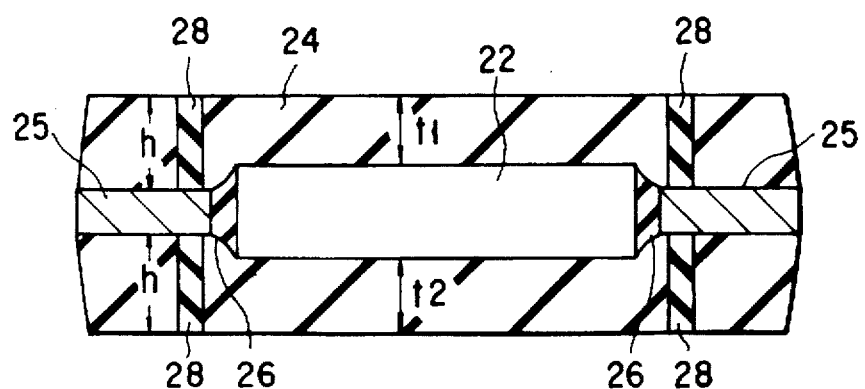
FIG. 12 is a cross-sectional view taken on line XII—XII of FIG. 11.

FIG. 11 shows the resin-molded type semiconductor device according to a second embodiment of this invention and FIG. 12 shows a cross-sectional view taken on line XII—XII of FIG. 11.

Referring to FIGS. 11 and 12, a plurality of inner leads 21 are disposed around a semiconductor chip 22. A plurality of outer leads 23 are exposed from a sealing resin 24 and immediately bent downward (or toward the back surface side of the semiconductor chip 22).

A support pin 25 is disposed at several places (at least two places) among a plurality of the inner leads 21. An adhesive 26 is applied between the distal end portion of the support pin 25 and the peripheral portion of the semiconductor chip 22 so as to fix the semiconductor chip 22 in place. A bonding wire 27 is disposed to effect a connection between each of the inner lead 21 and each corresponding electrode of the semiconductor chip 22. The support pin 25 is disposed only inside the sealing resin 24.

A pair of projected portions 28 are disposed at the distal end portion of at least one of the support pins 25 in proximate to the semiconductor chip 22 so as to extend upward (the upper surface side of the semiconductor chip 22) and downward (the back surface side of the semiconductor chip 22) from the distal end portion of the support pin 25. The pair of the projected portions 28 disposed on both sides of the distal end portion of the support pin 25 are positioned so as to overlap with each other as viewed from the upper side or bottom side of the semiconductor chip 22.

The height RhS and material of the projected portions 28 are the same as those of the projected portions 28 of the first example shown in FIGS. 9 and 10.

According to the resin-molded type semiconductor device represented by the aforementioned first and second examples, the semiconductor chip 22 is upheld by the support pins. Namely, this semiconductor device is not provided with a die pad for mounting the semiconductor chip 22, but provided with the support pins 25 for upholding the semiconductor chip 22 by the peripheral portions of thereof. Accordingly, it is possible to provide a very thin semiconductor device whose thickness after packaging is very close to the thickness of the semiconductor chip 22.

Even with this ultra-thin semiconductor device, the support pin 25 built therein is provided with the projected portions 28. This projected portion 28 is effective in preventing the support pin 25 from being deformed by the flow of the sealing resin during the resin-sealing thereof, thus controlling the positioning of the semiconductor chip 22. Namely, due to the presence of the projected portion 28, the upward or downward displacement of the semiconductor chip 22 within the resin 24 can be prevented, and hence the semiconductor chip 22 can be prevented from being exposed out of the sealing resin 24.

FIG. 13 shows the resin-molded type semiconductor device according to a third embodiment of this invention and FIG. 14 shows a cross-sectional view taken on line XIV—XIV of FIG. 13.

Referring to FIGS. 13 and 14, a plurality of inner leads 21 are disposed around a semiconductor chip 22. A plurality of outer leads 23 are exposed from a sealing resin 24 and immediately bent downward (or toward the back surface side of the semiconductor chip 22).

A support pin 25 is disposed at several places (at least two places) among a plurality of the inner leads 21. An adhesive 26 is applied between the distal end portion of the support pin 25 and the peripheral portion of the semiconductor chip 22 so as to fix the semiconductor chip 22 in place. A bonding wire 27 is disposed to effect a connection between each of the inner lead 21 and each corresponding electrode of the semiconductor chip 22. The support pin 25 is exposed from the sealing resin 24 and immediately bent downward (or toward the back surface side of the semiconductor chip 22).

A pair of projected portions 28 are disposed at a middle portion of at least one of the support pins 25 so as to extend upward (the upper surface side of the semiconductor chip 22) and downward (the back surface side of the semiconductor chip 22) from the middle portion of the support pin 25. The pair of the projected portions 28 disposed on both sides of the distal end portion of the support pin 25 are positioned so as to overlap with each other as viewed from the upper side or bottom side of the semiconductor chip 22.

The height RhS and material of the projected portions 28 are the same as those of the projected portions 28 of the first example shown in FIGS. 9 and 10.

The features of this example reside in that the projected portions 28 are disposed at a middle portion of the support pin 25. Namely, the projected portions 28 are not necessarily required to be disposed at the distal end portion of the support pin 25 in proximate to the semiconductor chip 22. However, the effect of preventing the upward or downward displacement of the semiconductor chip 22 within the resin 24 can be most conspicuous when the projected portions 28 are disposed at the distal end portion of the support pin 25 in proximate to the semiconductor chip 22.

FIG. 15 shows the resin-molded type semiconductor device according to a fourth embodiment of this invention and FIG. 16 shows a cross-sectional view taken on line XVI—XVI of FIG. 15.

Referring to FIGS. 15 and 16, a plurality of inner leads 21 are disposed around a semiconductor chip 22. A plurality of outer leads 23 are exposed from a sealing resin 24 and immediately bent downward (or toward the back surface side of the semiconductor chip 22).

A support pin 25 is disposed at several places (at least two places) among a plurality of the inner leads 21. An adhesive 26 is applied between the distal end portion of the support pin 25 and the peripheral portion of the semiconductor chip 22 so as to fix the semiconductor chip 22 in place. A bonding wire 27 is disposed to effect a connection between each of the inner lead 21 and each corresponding electrode of the semiconductor chip 22. The support pin 25 is exposed from the sealing resin 24 and immediately bent downward (or toward the back surface side of the semiconductor chip 22).

A pair of projected portions 28a and 28b are disposed at the distal end portion of at least one of the support pins 25 in proximate to the semiconductor chip 22 so as to extend upward (the upper surface side of the semiconductor chip 22) and downward (the back surface side of the semiconductor chip 22) respectively from the distal end portion of the support pin 25. The pair of the projected portions 28a and 28b disposed respectively on both sides of the distal end portion of the support pin 25 are positioned so as to overlap with each other as viewed from the upper side or bottom side of the semiconductor chip 22.

The height of the projected portion 28a differs from the height of the projected portion 28b.

Namely, the height Rh1S of the projected portion 28a disposed on the upper surface side of the semiconductor chip 22 is set to become larger than the height as measured from the surface of the inner lead 21 disposed on the upper surface side of the semiconductor chip 22 to the uppermost portion of the bonding wire 27, and at the same time to become smaller than the height as measured from the upper surface of the support pin 25 disposed on the upper surface side of the semiconductor chip 22 to the upper surface of the sealing resin 24 disposed on the upper surface side of the semiconductor chip 22.

In this case, the upper surface of the inner lead 21 disposed on the upper surface side of the semiconductor chip 22 is assumed to be flush with the upper surface of the support pin 25 disposed on the upper surface side of the semiconductor chip 22.

On the other hand, the height Rh2S of the projected portion 28b disposed on the back surface side of the semiconductor chip 22 is set to become larger than the height as measured from the back surface of the support pin 25 disposed on the back surface side of the semiconductor chip 22 to the back surface of the semiconductor chip 22, and at the same time to become smaller than the height as measured from the back surface of the support pin 25 disposed on the back surface side of the semiconductor chip 22 to the back surface of the sealing resin 24 disposed on the back surface side of the semiconductor chip 22.

Accordingly, the projected portion 28b disposed on the back surface side of the semiconductor chip 22 may be omitted if the back surface of the semiconductor chip 22 is flush or approximately flush with the back surface of the support pin 25 disposed on the back surface side of the semiconductor chip 22.

In the case of the semiconductor device of this example, the pair of projected portions 28a and 28b are not exposed out of the resin 24. The thickness Rt1S of the sealing resin 24 disposed on the upper surface side of the semiconductor chip 22 may be equal to or different from the thickness Rt2S of the sealing resin 24 disposed on the back surface side of the semiconductor chip 22.

The other constructions (such as material) of the projected portion 28a and 28b are the same as those of the projected portions 28 of the first example shown in FIGS. 9 and 10.

FIG. 17 shows the resin-molded type semiconductor device according to a fifth embodiment of this invention and FIG. 18 shows a cross-sectional view taken on line XVIII—XVIII of FIG. 17.

Referring to FIGS. 17 and 18, a plurality of inner leads 21 are disposed around a semiconductor chip 22. A plurality of outer leads 23 are exposed from a sealing resin 24 and immediately bent downward (or toward the back surface side of the semiconductor chip 22).

A support pin 25 is disposed at several places (at least two places) among a plurality of the inner leads 21. An adhesive 26 is applied between the distal end portion of the support pin 25 and the peripheral portion of the semiconductor chip 22 so as to fix the semiconductor chip 22 in place. A bonding wire 27 is disposed to effect a connection between each of the inner lead 21 and each corresponding electrode of the semiconductor chip 22. The support pin 25 is exposed from the sealing resin 24 and immediately bent downward (or toward the back surface side of the semiconductor chip 22).

A pair of projected portions 28 are disposed at the distal end portion of at least one of the support pins 25 in proximate to the semiconductor chip 22 so as to extend upward (the upper surface side of the semiconductor chip 22) and downward (the back surface side of the semiconductor chip 22) respectively from the distal end portion of the support pin 25. The pair of the projected portions 28 disposed respectively on both sides of the distal end portion of the support pin 25 are positioned so as to overlap with each other as viewed from the upper side or bottom side of the semiconductor chip 22.

The shape of the projected portion 28 is trapezoid. However, the shape of the projected portion 28 gives no influence to the effects of this invention.

The other constructions such as height RhS and material of the projected portions 28 are the same as those of the projected portions 28 of the first example shown in FIGS. 9 and 10.

FIG. 19 shows the resin-molded type semiconductor device according to a sixth embodiment of this invention and FIG. 20 shows a cross-sectional view taken on line XX—XX of FIG. 19.

Referring to FIGS. 19 and 20, a plurality of inner leads 21 are disposed around a semiconductor chip 22. A plurality of outer leads 23 are exposed from a sealing resin 24 and immediately bent downward (or toward the back surface side of the semiconductor chip 22).

A support pin 25 is disposed at several places (at least two places) among a plurality of the inner leads 21. An adhesive 26 is applied between the distal end portion of the support pin 25 and the peripheral portion of the semiconductor chip 22 so as to fix the semiconductor chip 22 in place. A bonding wire 27 is disposed to effect a connection between each of the inner lead 21 and each corresponding electrode of the semiconductor chip 22. The support pin 25 is exposed from the sealing resin 24 and immediately bent downward (or toward the back surface side of the semiconductor chip 22).

A pair of projected portions 28 are disposed at the distal end portion of at least one of the support pins 25 in proximate to the semiconductor chip 22 so as to extend upward (the upper surface side of the semiconductor chip 22) and downward (the back surface side of the semiconductor chip 22) respectively from the distal end portion of the support pin 25. The pair of the projected portions 28 disposed respectively on both sides of the distal end portion of the support pin 25 are positioned so as to overlap with each other as viewed from the upper side or bottom side of the semiconductor chip 22.

The shape of the projected portion 28 is prismatic. However, the shape of the projected portion 28 gives no influence to the effects of this invention.

The other constructions such as height RhS and material of the projected portions 28 are the same as those of the projected portions 28 of the first example shown in FIGS. 9 and 10.

FIG. 21 shows the resin-molded type semiconductor device according to a seventh embodiment of this invention and FIG. 22 shows a cross-sectional view taken on line XX—XX of FIG. 21.

Referring to FIGS. 21 and 22, a plurality of inner leads 21 are disposed around a semiconductor chip 22. A plurality of outer leads 23 are exposed from a sealing resin 24 and immediately bent downward (or toward the back surface side of the semiconductor chip 22).

A support pin 25 is disposed at several places (at least two places) among a plurality of the inner leads 21. An adhesive 26 is applied between the distal end portion of the support pin 25 and the peripheral portion of the semiconductor chip 22 so as to fix the semiconductor chip 22 in place. A bonding wire 27 is disposed to effect a connection between each of the inner lead 21 and each corresponding electrode of the semiconductor chip 22. The support pin 25 is exposed from the sealing resin 24 and immediately bent downward (or toward the back surface side of the semiconductor chip 22).

A pair of projected portions 28 are disposed at a portion of at least one of the support pins 25 in proximate to the semiconductor chip 22 so as to extend upward (the upper surface side of the semiconductor chip 22) and downward (the back surface side of the semiconductor chip 22) respectively from the distal end portion of the support pin 25. The pair of the projected portions 28 disposed respectively on both sides of the distal end portion of the support pin 25 are positioned so as to overlap with each other as viewed from the upper side or bottom side of the semiconductor chip 22.

The length of the projected portion 28 in this example is approximately the same as the length of a portion of the support pin 25 which is buried within the resin 24, and the size of the projected portion 28 is also the largest among the examples so far explained above. Namely, this projected portion 28 can be easily disposed on the support pin 25. Furthermore, the strength of the projected portion 28 as well as the accuracy in positioning the semiconductor chip 22 can be improved.

The shape of the projected portion 28 is prismatic. However, the shape of the projected portion 28 gives no influence to the effects of this invention.

The other constructions such as height RhS and material of the projected portions 28 are the same as those of the projected portions 28 of the first example shown in FIGS. 9 and 10.

FIG. 23 shows the resin-molded type semiconductor device according to an eighth embodiment of this invention and FIG. 24 shows a cross-sectional view taken on line XXIV—XXIV of FIG. 23.

Referring to FIGS. 23 and 24, a plurality of inner leads 21 are disposed around a semiconductor chip 22. A plurality of outer leads 23 are exposed from a sealing resin 24 and immediately bent downward (or toward the back surface side of the semiconductor chip 22).

A support pin 25 is disposed at several places (at least two places) among a plurality of the inner leads 21. An adhesive 26 is applied between the distal end portion of the support pin 25 and the peripheral portion of the semiconductor chip 22 so as to fix the semiconductor chip 22 in place. A bonding wire 27 is disposed to effect a connection between each of the inner lead 21 and each corresponding electrode of the semiconductor chip 22. The support pin 25 is exposed from the sealing resin 24 and immediately bent downward (or toward the back surface side of the semiconductor chip 22).

A pair of projected portions 28 are disposed at a distal end portion of at least one of the support pins 25 in proximate to the semiconductor chip 22 so as to extend upward (the upper surface side of the semiconductor chip 22) and downward (the back surface side of the semiconductor chip 22) respectively from the distal end portion of the support pin 25. The pair of the projected portions 28 disposed respectively on both sides of the distal end portion of the support pin 25 are positioned so as to overlap with each other as viewed from the upper side or bottom side of the semiconductor chip 22.

The projected portion 28 is extended widthwise from the support pin 25 in this example. However, this enlarged projected portion 28 does not touch with the neighboring inner leads 21. Accordingly, this enlarged projected portion 28 does not give any bad electric influence to the semiconductor device. Since this projected portion 28 is enlarged in cross direction of the support pin 25, the projected portion 28 can be easily handled.

The other constructions such as height RhS and material of the projected portions 28 are the same as those of the projected portions 28 of the first example shown in FIGS. 9 and 10.

FIG. 25 shows the resin-molded type semiconductor device according to a ninth embodiment of this invention and FIG. 26 shows a cross-sectional view taken on line XXVI—XXVI of FIG. 25.

Referring to FIGS. 25 and 26, a plurality of inner leads 21 are disposed around a semiconductor chip 22. A plurality of outer leads 23 are exposed from a sealing resin 24 and immediately bent downward (or toward the back surface side of the semiconductor chip 22).

A support pin 25 is disposed at several places (at least two places) among a plurality of the inner leads 21. An adhesive 26 is applied between the distal end portion of the support pin 25 and the peripheral portion of the semiconductor chip 22 so as to fix the semiconductor chip 22 in place. A bonding wire 27 is disposed to effect a connection between each of the inner lead 21 and each corresponding electrode of the semiconductor chip 22. The support pin 25 is exposed from the sealing resin 24 and immediately bent downward (or toward the back surface side of the semiconductor chip 22).

A pair of projected portions 28 are disposed at a portion of at least one of the support pins 25 in proximate to the semiconductor chip 22 so as to extend upward (the upper surface side of the semiconductor chip 22) and downward (the back surface side of the semiconductor chip 22) respectively from the distal end portion of the support pin 25. The pair of the projected portions 28 disposed respectively on both sides of the distal end portion of the support pin 25 are positioned so as to overlap with each other as viewed from the upper side or bottom side of the semiconductor chip 22.

The projected portion 28 is extended widthwise from the support pin 25 in this example and touches with the neighboring inner leads 21. However, since the projected portion 28 is formed of an insulating material, this enlarged projected portion 28 does not give any bad electric influence to the semiconductor device.

The other constructions such as height RhS and material of the projected portions 28 are the same as those of the projected portions 28 of the first example shown in FIGS. 9 and 10.

FIGS. 27 to 30 show the resin-molded type semiconductor device according to a tenth embodiment of this invention. FIG. 29 shows a cross-sectional view taken on line XXIX—XXIX of FIG. 28. FIG. 30 shows a front view of a support pin 25 as viewed from the distal end thereof.

According to this semiconductor device, the support pin 25 and a projection 28 are integrally formed with each other. Namely, the support pin 25 and the projection 28 are formed from a single and same lead frame.

For example, as shown in FIG. 27, a pair of projected portions 28U are formed in advance orthogonally on the distal end portion of support pin 25 at the occasion of manufacturing the lead frame. Then, as shown in FIG. 28, one of the projected portions 28U is bent over one surface (for example, upper surface) of the support pin 25 and the other one of the projected portions 28U is bent over the other surface (for example, back surface) of the support pin 25. As a result, a pair of projected portions extending toward opposite way from each other are formed respectively on both sides of the support pin 25.

Figure 31:
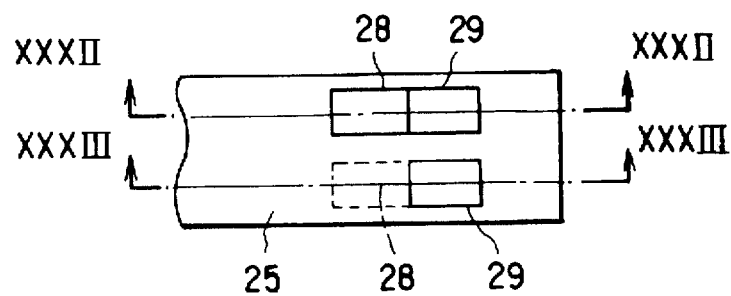
FIG. 31 is a plan view showing the resin-molded type semiconductor device according to an eleventh embodiment of this invention.
Figure 32:
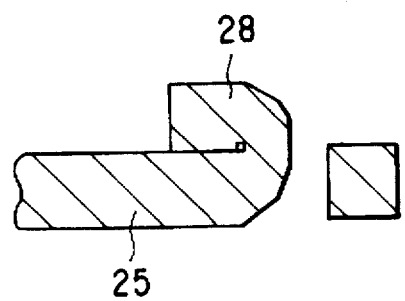
FIG. 32 is a cross-sectional view taken on line XXXII—XXXII of FIG. 31.
Figure 33:
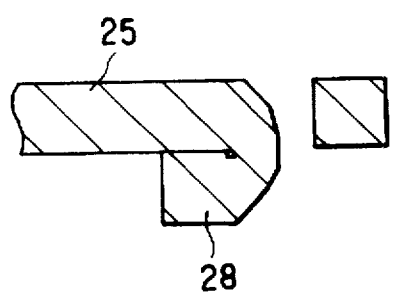
FIG. 33 is a cross-sectional view taken on line XXXIII—XXXIII of FIG. 31.

FIGS. 31 to 33 show the resin-molded type semiconductor device according to an eleventh embodiment of this invention. FIG. 32 shows a cross-sectional view taken on line XXXII—XXXII of FIG. 31. FIG. 33 shows a cross-sectional view taken on line XXXIII—XXXIII of FIG. 31.

According to this semiconductor device, the support pin 25 and a projection 28 are integrally formed with each other. Namely, the support pin 25 and the projection 28 are formed from a single and same lead frame.

For example, as shown in FIG. 31, a pair of parallel cut portions 29 are formed in advance in the cross direction of support pin 25 at the occasion of manufacturing the lead frame. Then, as shown in FIGS. 31 to 33, one of the parallel cut portions 29 is bent over one surface (for example, upper surface) of the support pin 25 and the other one of the projected portions 28U is bent over the other surface (for example, back surface) of the support pin 25. As a result, a pair of projected portions extending toward opposite way from each other are formed respectively on both sides of the support pin 25.

According to the tenth and eleventh examples, the projected portions 28 can be easily formed saving the manufacturing cost of the semiconductor device.

Figure 34:
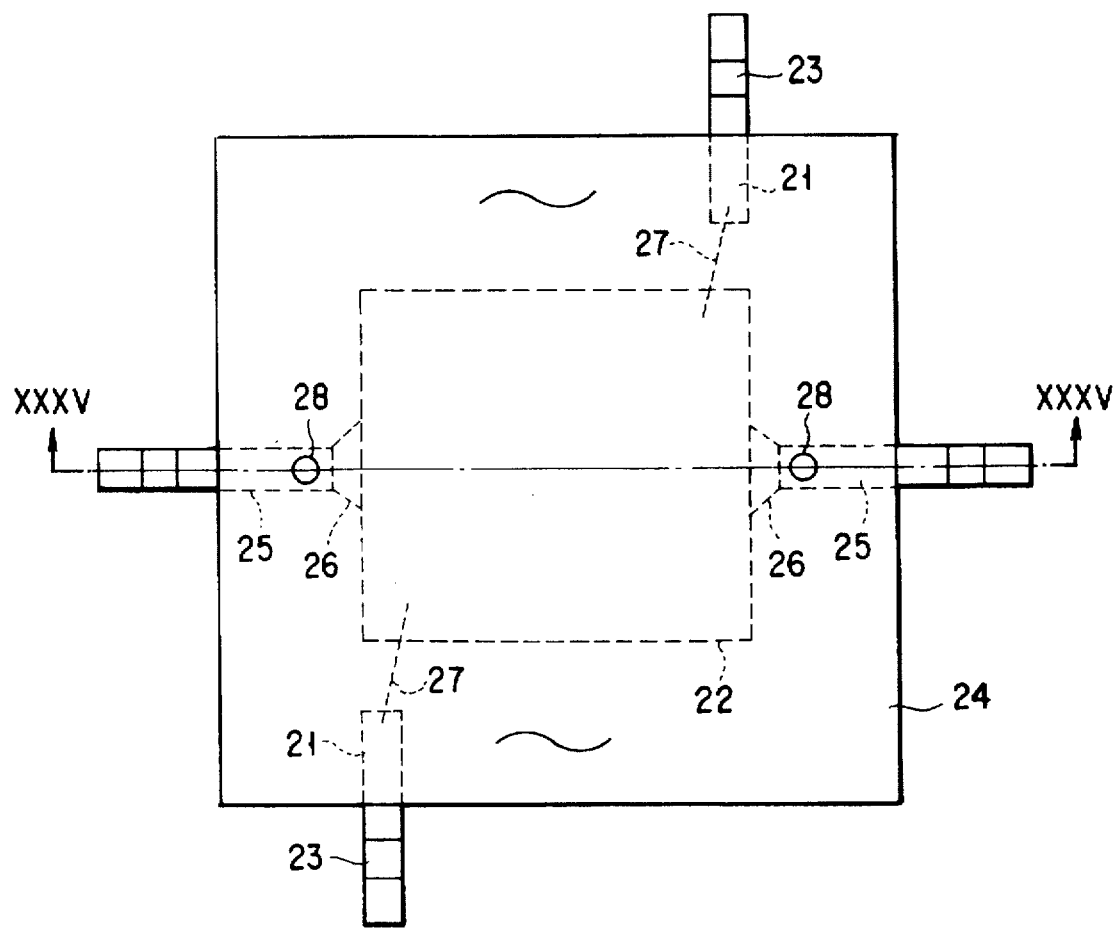
FIG. 34 is a plan view showing the resin-molded type semiconductor device according to a twelfth embodiment of this invention.
Figure 35:
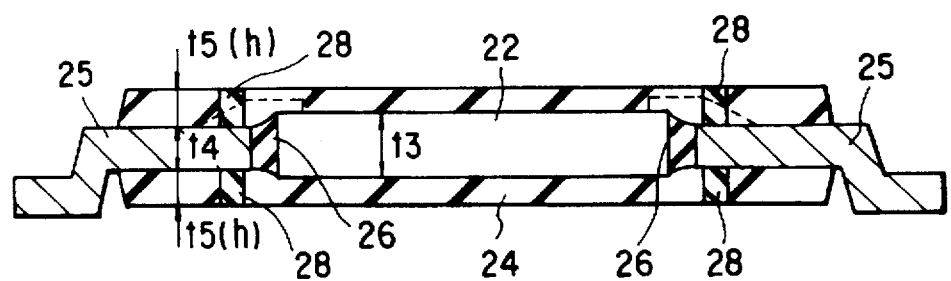
FIG. 35 is a cross-sectional view taken on line XXXV—XXXV of FIG. 34.

FIG. 34 shows the resin-molded type semiconductor device according to a twelfth embodiment of this invention and FIG. 35 shows a cross-sectional view taken on line XXXV—XXXV of FIG. 34.

Referring to FIGS. 34 and 35, a plurality of inner leads 21 are disposed around a semiconductor chip 22. A plurality of outer leads 23 are exposed from a sealing resin 24 and immediately bent downward (or toward the back surface side of the semiconductor chip 22).

A support pin 25 is disposed at several places (at least two places) among a plurality of the inner leads 21. An adhesive 26 is applied between the distal end portion of the support pin 25 and the peripheral portion of the semiconductor chip 22 so as to fix the semiconductor chip 22 in place. A bonding wire 27 is disposed to effect a connection between each of the inner lead 21 and each corresponding electrode of the semiconductor chip 22. The support pin 25 is exposed from the sealing resin 24 and immediately bent downward (or toward the back surface side of the semiconductor chip 22).

A pair of projected portions 28 are disposed at the distal end portion of at least one of the support pins 25 in proximate to the semiconductor chip 22 so as to extend upward (the upper surface side of the semiconductor chip 22) and downward (the back surface side of the semiconductor chip 22) from the distal end portion of the support pin 25. The pair of the projected portions 28 disposed on both sides of the distal end portion of the support pin 25 are positioned so as to overlap with each other as viewed from the upper side or bottom side of the semiconductor chip 22.

The height RhS of each projected portion 28 is the same with each other. The surface of the projected portion 28 exposed out of the resin 24 is flush with the surface of the resin 24.

This example represents a semiconductor chip 22 having the least thickness Rt3S among the examples so far explained above. The thickness Rt3S of the semiconductor chip 22 is almost the same as the thickness Rt4S of the lead frame (support pin). In this case, the thickness Rt5S (the height RhS of the projected portion 28) of the sealing resin 24 formed on the upper surface and on the back surface of the semiconductor chip 22 is smaller than the thickness Rt4S of the lead frame (support pin).

The adhesive 26 may be formed of either an insulating material or a conductive material. The projected portions 28 may also be formed of either an insulating material or a conductive material.

If a predetermined potential such as ground potential is to be supplied to the semiconductor chip 22, both of the adhesive 26 and the projected portion 28 should be formed of a conductive material. If the adhesive 26 is formed of an insulating material, the semiconductor chip 22 would not be electrically influenced from the outside of the resin 24.

When the projected portion 28 is formed of a heat-conductive material such as a metal, any heat generating from the semiconductor chip 22 may be effectively diffused out of the sealing resin 24.

The projected portion 28 should preferably be formed of a material which is inferior in strength than that of material constituting a die in order to prevent the abrasion of the die.

According to the resin-molded type semiconductor device of this example, the thickness of the projected portion 28 can be made very thin. For example, since the thickness of the lead frame is about 2005 m in general, the thickness of the projected portion 28 can be made as thin as 2005 m or less.

As a result, it is possible to easily provide an ultra-thin semiconductor device. At the same time, since the strength and stability of the projected portion 28 can be improved according to this example, any possibility of the projected portions 28 being deformed or stripped away during the transportation of the semiconductor device, or the projected portions 28 being swept away during transfer molding can be avoided.

Figure 36:
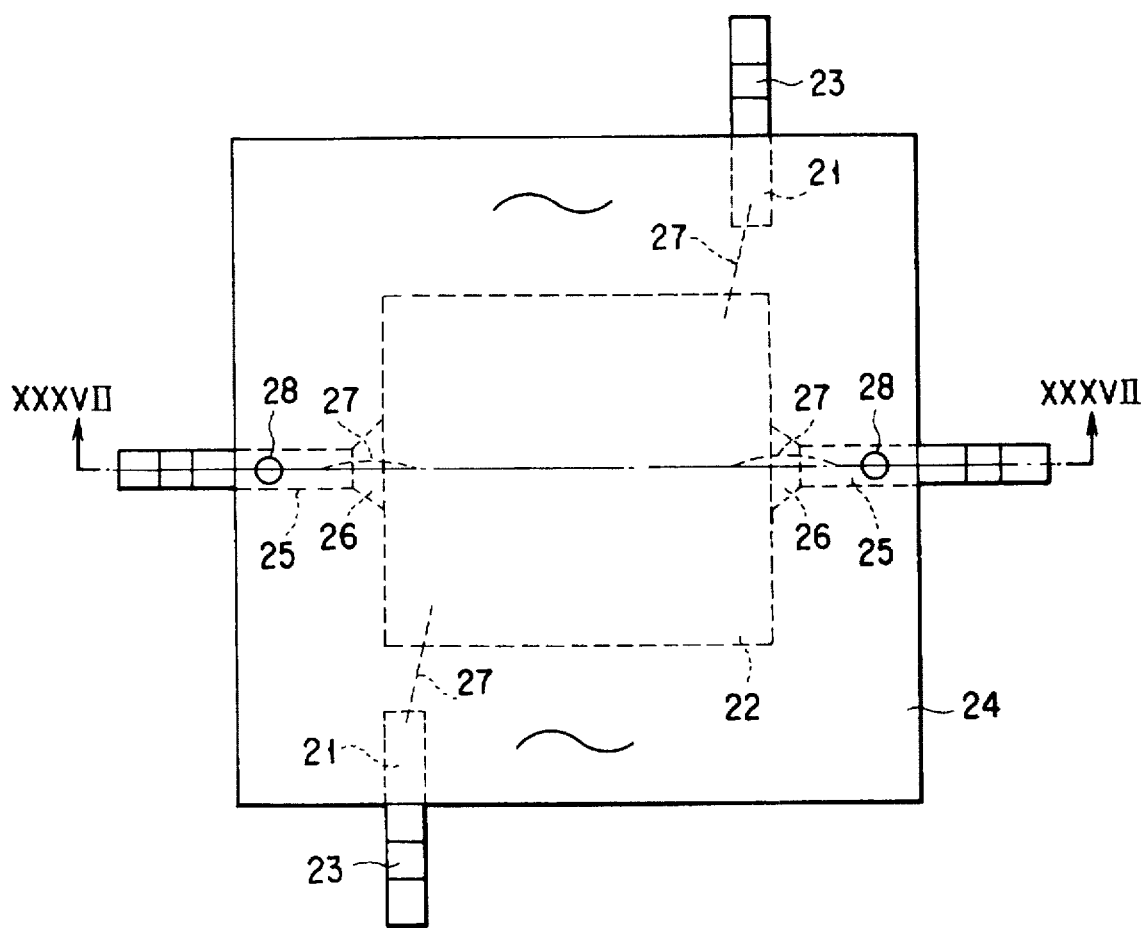
FIG. 36 is a plan view showing the resin-molded type semiconductor device according to a thirteenth embodiment of this invention.
Figure 37:
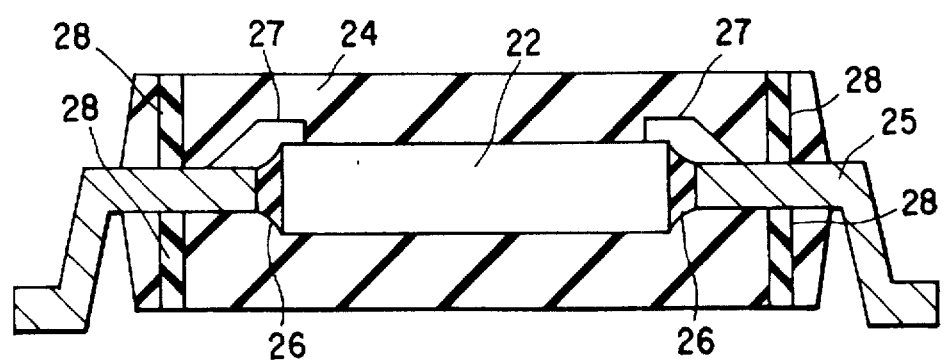
FIG. 37 is a cross-sectional view taken on line XXXVII—XXXVII of FIG. 36.

FIG. 36 shows the resin-molded type semiconductor device according to a thirteenth embodiment of this invention and FIG. 37 shows a cross-sectional view taken on line XXXVII—XXXVII of FIG. 36.

Referring to FIGS. 36 and 37, a plurality of inner leads 21 are disposed around a semiconductor chip 22. A plurality of outer leads 23 are exposed from a sealing resin 24 and immediately bent downward (or toward the back surface side of the semiconductor chip 22).

A support pin 25 is disposed at several places (at least two places) among a plurality of the inner leads 21. An adhesive 26 is applied between the distal end portion of the support pin 25 and the peripheral portion of the semiconductor chip 22 so as to fix the semiconductor chip 22 in place. A bonding wire 27 is disposed to effect a connection between each of the inner lead 21 and each corresponding electrode of the semiconductor chip 22, as well as a connection between each of the support pins 25 and each corresponding electrode of the semiconductor chip 22. The support pin 25 is exposed from the sealing resin 24 and immediately bent downward (or toward the back surface side of the semiconductor chip 22).

A pair of projected portions 28 are disposed at a portion of at least one of the support pins 25 so as to extend upward (the upper surface side of the semiconductor chip 22) and downward (the back surface side of the semiconductor chip 22) from the distal end portion of the support pin 25. The pair of the projected portions 28 disposed on both sides of the distal end portion of the support pin 25 are positioned so as to overlap with each other as viewed from the upper side or bottom side of the semiconductor chip 22.

The height RhS of each projected portion 28 is the same with each other. The surface of the projected portion 28 exposed out of the resin 24 is flush with the surface of the resin 24.

The other constructions such as height RhS and material of the projected portions 28 are the same as those of the projected portions 28 of the first example shown in FIGS. 9 and 10.

In this example, the connection between each of the support pins 25 and each corresponding electrode of the semiconductor chip 22 is effected by the bonding wire 27. In this case, the projected portion 28 is formed of an insulating material. The adhesive 26 may be formed of either an insulating material or a conductive material. If adhesive 26 is formed of a conductive material, a reference potential such as ground potential will be applied to the support pin 25.

Figure 38:
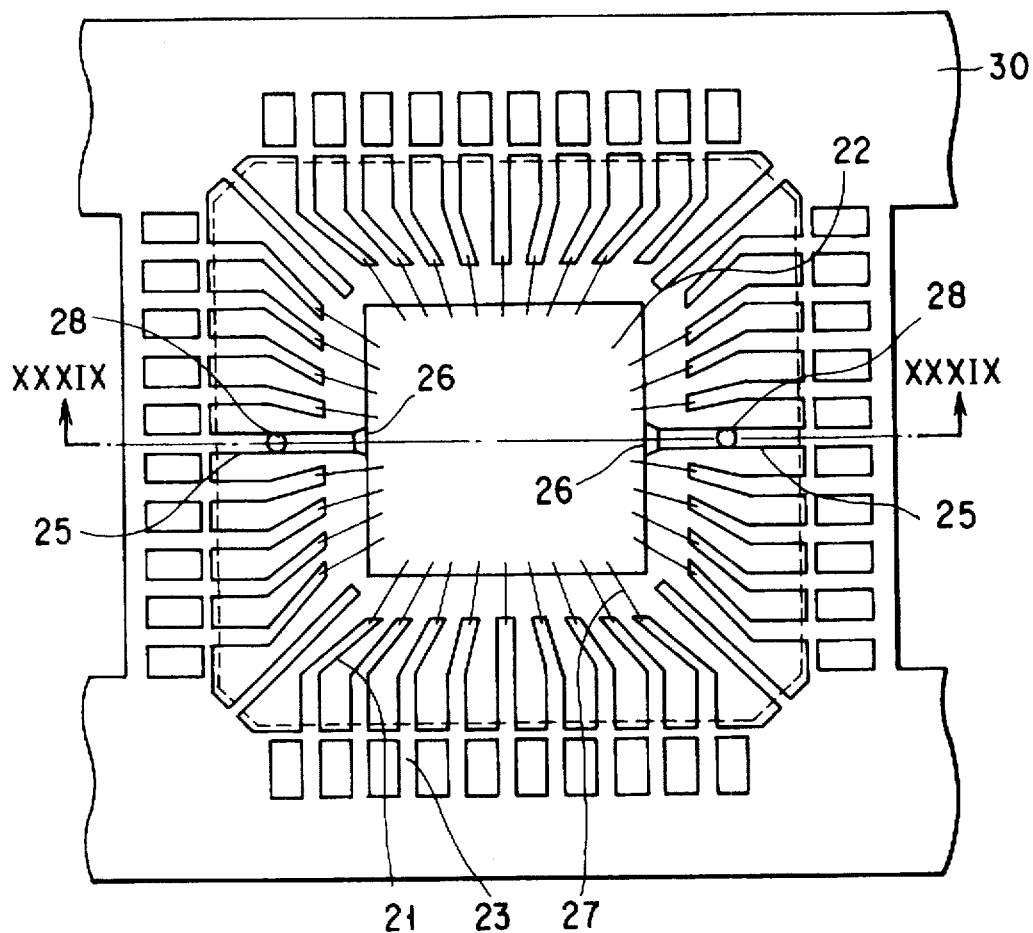
FIG. 38 is a plan view showing the resin-molded type semiconductor device according to a fourteenth embodiment of this invention.
Figure 39:
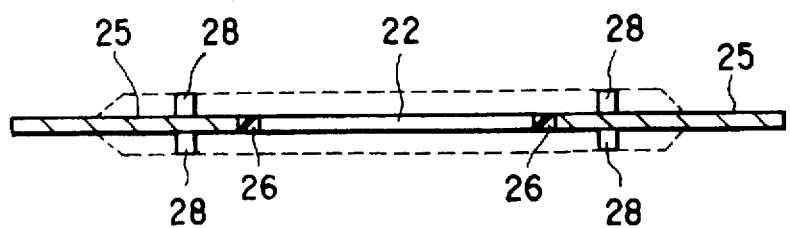
FIG. 39 is a cross-sectional view taken on line XXXIX—XXXIX of FIG. 38.

FIG. 38 shows the resin-molded type semiconductor device according to a fourteenth embodiment of this invention and FIG. 39 shows a cross-sectional view taken on line XXXIX—XXXIX of FIG. 38.

Referring to FIGS. 38 and 39, the lead frame comprises inner leads 21, outer leads 23, support pins 25 and an outer frame 30.

The semiconductor chip 22 is mounted on a central space of the lead frame. Each end portion of the inner leads 21 is disposed to surround the periphery of the semiconductor chip 22.

A support pin 25 is disposed at several places (at least two places) among a plurality of the inner leads 21. For example, the support pins 25 are disposed respectively at a pair of opposite sides of the semiconductor chip 22 (the total number of the support pins 25 being two).

An adhesive 26 is applied between the distal end portion of the support pin 25 and the peripheral portion of the semiconductor chip 22 so as to fix the facing two sides of the semiconductor chip 22. A bonding wire 27 is disposed to effect a connection between each of the inner lead 21 and each corresponding electrode of the semiconductor chip 22, as well as a connection between each of the support pins 25 and each corresponding electrode of the semiconductor chip 22.

The projected portions 28 are disposed on the upper surface side and the back surface side of each support pin 25 respectively, i.e. four in total. The pair of the projected portions 28 disposed on both sides of each of the support pins 25 are positioned to overlap with each other as viewed from the upper side or bottom side of the semiconductor chip 22. The height RhS of each projected portion 28 is the same with each other.

The region encircled by a broken line represents a region to be sealed by a resin.

The other constructions such as height RhS and material of the projected portions 28 are the same as those of the projected portions 28 of the first example shown in FIGS. 9 and 10.

Figure 40:
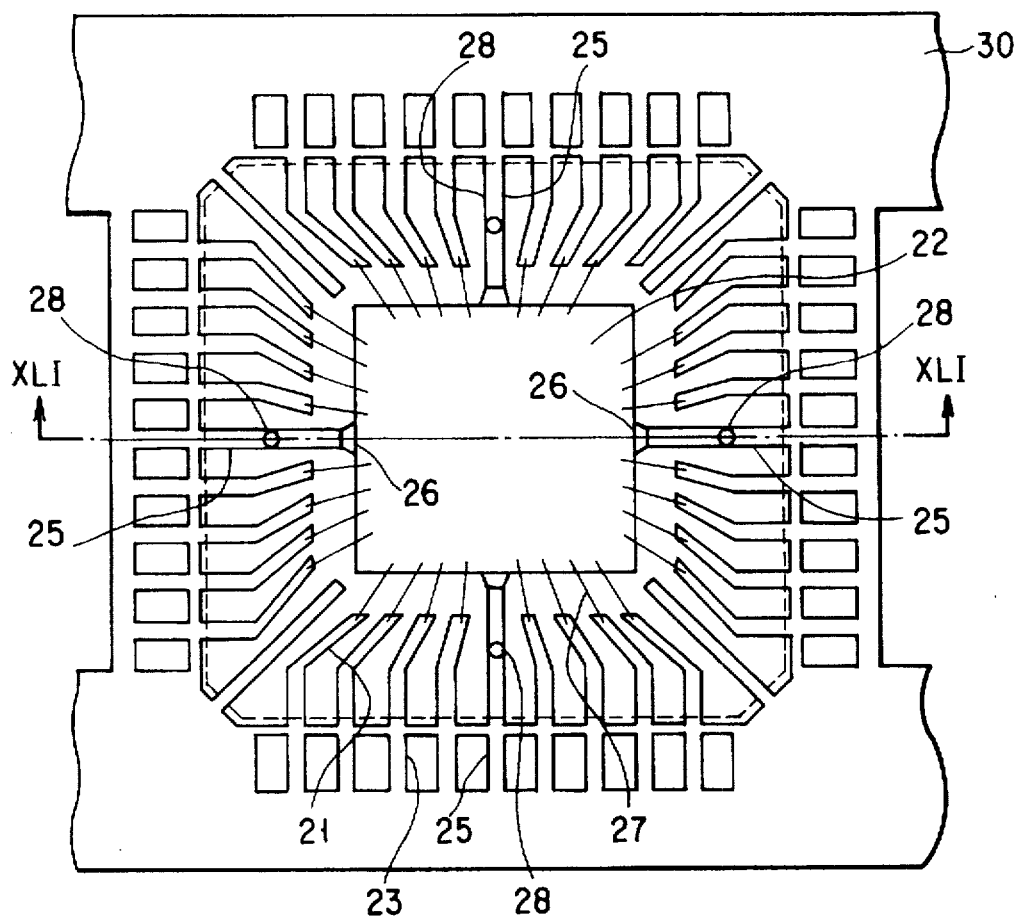
FIG. 40 is a plan view showing the resin-molded type semiconductor device according to a fifteenth embodiment of this invention.
Figure 41:
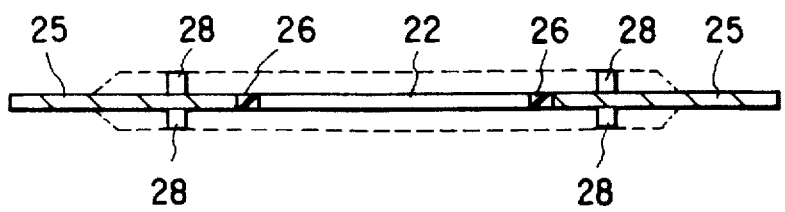
FIG. 41 is a cross-sectional view taken on line XLI—XLI of FIG. 40.

FIG. 40 shows the resin-molded type semiconductor device according to a fifteenth embodiment of this invention and FIG. 41 shows a cross-sectional view taken on line XLI—XLI of FIG. 40.

Referring to FIGS. 40 and 41, the lead frame comprises inner leads 21, outer leads 23, support pins 25 and an outer frame 30.

The semiconductor chip 22 is mounted on a central space of the lead frame. Each end portion of the inner leads 21 is disposed to surround the periphery of the semiconductor chip 22.

A support pin 25 is disposed at several places (at least two places) among a plurality of the inner leads 21. For example, the support pin 25 is disposed respectively at each side of the semiconductor chip 22 (the total number of the support pins 25 being four).

An adhesive 26 is applied between the distal end portion of the support pin 25 and the peripheral portion of the semiconductor chip 22 so as to fix four sides of the semiconductor chip 22. A bonding wire 27 is disposed to effect a connection between each of the inner lead 21 and each corresponding electrode of the semiconductor chip 22, as well as a connection between each of the support pins 25 and each corresponding electrode of the semiconductor chip 22.

The projected portions 28 are disposed on the upper surface side and the back surface side of each support pin 25 respectively, i.e. eight in total. The pair of the projected portions 28 disposed on both sides of each of the support pins 25 are positioned to overlap with each other as viewed from the upper side or bottom side of the semiconductor chip 22. The height RhS of each projected portion 28 is the same with each other.

The region encircled by a broken line represents a region to be sealed by a resin.

The other constructions such as height RhS and material of the projected portions 28 are the same as those of the projected portions 28 of the first example shown in FIGS. 9 and 10.

According to this example, the semiconductor chip 22 is more firmly fixed as compared with the aforementioned example 14. Namely, the tilting of the semiconductor chip 22 by the rotation thereof as well as the upward or downward displacement of the semiconductor chip 22 can be effectively prevented according to this example.

Figure 42:
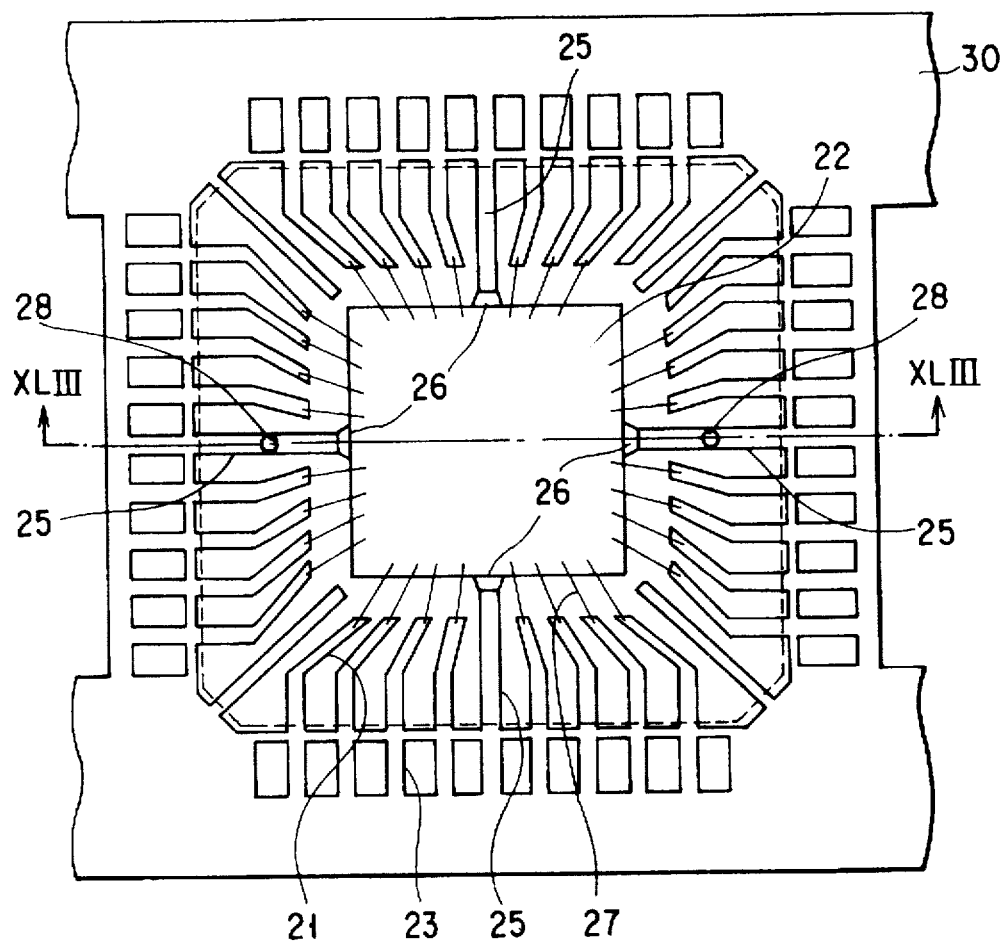
FIG. 42 is a plan view showing the resin-molded type semiconductor device according to a sixteenth embodiment of this invention.
Figure 43:
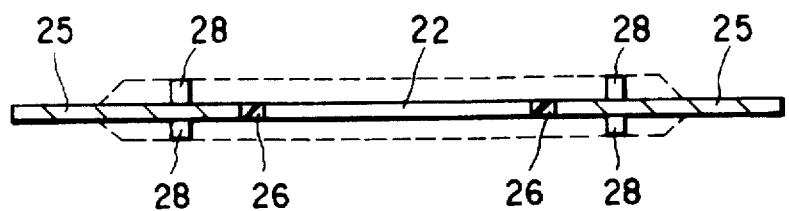
FIG. 43 is a cross-sectional view taken on line XLIII—XLIII of FIG. 42.

FIG. 42 shows the resin-molded type semiconductor device according to a sixteenth embodiment of this invention and FIG. 43 shows a cross-sectional view taken on line XLIII—XLIII of FIG. 42.

Referring to FIGS. 42 and 43, the lead frame comprises inner leads 21, outer leads 23, support pins 25 and an outer frame 30.

The semiconductor chip 22 is mounted on a central space of the lead frame. Each end portion of the inner leads 21 is disposed to surround the periphery of the semiconductor chip 22.

A support pin 25 is disposed at several places (at least two places) among a plurality of the inner leads 21. For example, the support pin 25 is disposed respectively at each side of the semiconductor chip 22 (the total number of the support pins 25 being four).

An adhesive 26 is applied between the distal end portion of the support pin 25 and the peripheral portion of the semiconductor chip 22 so as to fix four sides of the semiconductor chip 22. A bonding wire 27 is disposed to effect a connection between each of the inner lead 21 and each corresponding electrode of the semiconductor chip 22, as well as a connection between each of the support pins 25 and each corresponding electrode of the semiconductor chip 22.

The projected portions 28 are disposed on the upper surface side and the back surface side of only two opposed support pins 25 out of four support pins 25, i.e. four in total. The pair of the projected portions 28 disposed on both sides of the support pins 25 are positioned to overlap with each other as viewed from the upper side or bottom side of the semiconductor chip 22. The height RhS of each projected portion 28 is the same with each other.

The region encircled by a broken line represents a region to be sealed by a resin.

The other constructions such as height RhS and material of the projected portions 28 are the same as those of the projected portions 28 of the first example shown in FIGS. 9 and 10.

Figure 44:
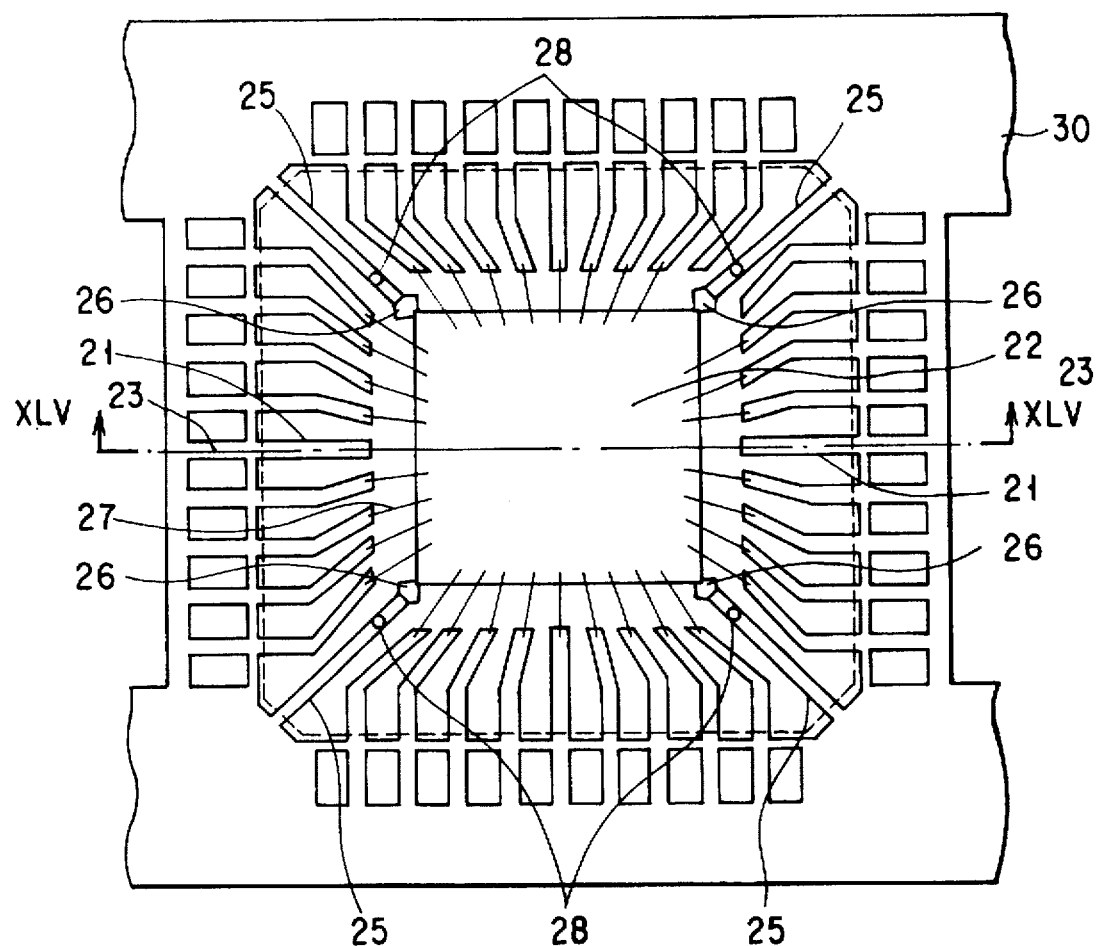
FIG. 44 is a plan view showing the resin-molded type semiconductor device according to a seventeenth embodiment of this invention.
Figure 45:
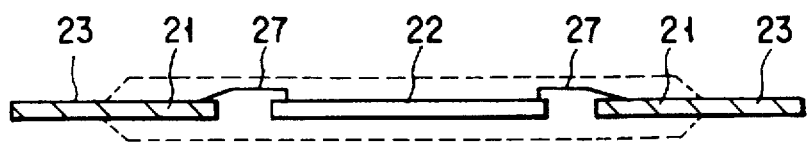
FIG. 45 is a cross-sectional view taken on line XLX—XLX of FIG. 44.

FIG. 44 shows the resin-molded type semiconductor device according to a seventeenth embodiment of this invention and FIG. 45 shows a cross-sectional view taken on line XLV—XLV of FIG. 44.

Referring to FIGS. 44 and 45, the lead frame comprises inner leads 21, outer leads 23, support pins 25 and an outer frame 30.

The semiconductor chip 22 is mounted on a central space of the lead frame. Each end portion of the inner leads 21 is disposed to surround the periphery of the semiconductor chip 22.

A support pin 25 is disposed at several places (at least two places) among a plurality of the inner leads 21. For example, the support pin 25 is disposed respectively at each of four corners of the semiconductor chip 22 (the total number of the support pins 25 being four).

An adhesive 26 is applied between the distal end portion of the support pin 25 and the peripheral portion of the semiconductor chip 22 so as to fix four corners of the semiconductor chip 22. A bonding wire 27 is disposed to effect a connection between each of the inner lead 21 and each corresponding electrode of the semiconductor chip 22, as well as a connection between each of the support pins 25 and each corresponding electrode of the semiconductor chip 22.

The projected portions 28 are disposed on the upper surface side and the back surface side of each support pin 25 respectively, i.e. eight in total. The pair of the projected portions 28 disposed on both sides of each of the support pins 25 are positioned to overlap with each other as viewed from the upper side or bottom side of the semiconductor chip 22. The height RhS of each projected portion 28 is the same with each other.

The region encircled by a broken line represents a region to be sealed by a resin.

The other constructions such as height RhS and material of the projected portions 28 are the same as those of the projected portions 28 of the first example shown in FIGS. 9 and 10.

FIG. 46 shows the resin-molded type semiconductor device according to an eighteenth embodiment of this invention and FIG. 47 shows a cross-sectional view taken on line XLVII—XLVII of FIG. 46.

Referring to FIGS. 46 and 47, the lead frame comprises inner leads 21, outer leads 23, support pins 25 and an outer frame 30.

The semiconductor chip 22 is mounted on a central space of the lead frame. Each end portion of the inner leads 21 is disposed to surround the periphery of the semiconductor chip 22.

A support pin 25 is disposed at several places (at least two places) among a plurality of the inner leads 21. For example, the support pin 25 is disposed respectively at each of four corners of the semiconductor chip 22 (the total number of the support pins 25 being four).

An adhesive 26 is applied between the distal end portion of the support pin 25 and the peripheral portion of the semiconductor chip 22 so as to fix four corners of the semiconductor chip 22. A bonding wire 27 is disposed to effect a connection between each of the inner lead 21 and each corresponding electrode of the semiconductor chip 22, as well as a connection between each of the support pins 25 and each corresponding electrode of the semiconductor chip 22.

The projected portions 28 are disposed on the upper surface side and the back surface side of only two opposed support pins 25 out of four support pins 25, i.e. the projected portions 28 being four in total. The pair of the projected portions 28 disposed on both sides of the support pins 25 are positioned to overlap with each other as viewed from the upper side or bottom side of the semiconductor chip 22. The height RhS of each projected portion 28 is the same with each other.

The region encircled by a broken line represents a region to be sealed by a resin.

The other constructions such as height RhS and material of the projected portions 28 are the same as those of the projected portions 28 of the first example shown in FIGS. 9 and 10.

FIG. 48 shows the resin-molded type semiconductor device according to a nineteenth embodiment of this invention and FIG. 49 shows a cross-sectional view taken on line XLIX—XLIX of FIG. 48.

Referring to FIGS. 48 and 49, the lead frame comprises inner leads 21, outer leads 23, support pins 25 and an outer frame 30.

The semiconductor chip 22 is mounted on a central space of the lead frame. Each end portion of the inner leads 21 is disposed to surround the periphery of the semiconductor chip 22.

A support pin 25 is disposed at several places (at least two places) among a plurality of the inner leads 21. For example, the support pin 25 is disposed respectively at each of four sides and four corners of the semiconductor chip 22 (the total number of the support pins 25 being eight).

An adhesive 26 is applied between the distal end portion of the support pin 25 and the peripheral portion of the semiconductor chip 22 so as to fix four sides and four corners of the semiconductor chip 22. A bonding wire 27 is disposed to effect a connection between each of the inner lead 21 and each corresponding electrode of the semiconductor chip 22, as well as a connection between each of the support pins 25 and each corresponding electrode of the semiconductor chip 22.

The projected portions 28 are disposed on the upper surface side and the back surface side of each support pin 25 respectively, i.e. sixteen in total. The pair of the projected portions 28 disposed on both sides of each of the support pins 25 are positioned to overlap with each other as viewed from the upper side or bottom side of the semiconductor chip 22. The height RhS of each projected portion 28 is the same with each other.

The region encircled by a broken line represents a region to be sealed by a resin.

The other constructions such as height RhS and material of the projected portions 28 are the same as those of the projected portions 28 of the first example shown in FIGS. 9 and 10.

In the aforementioned examples 14 to 19, as the number of the support pin 25 is increased, the tilting or movement of the semiconductor chip 22 can be minimized. Further, as the number of the projected portion 28 is increased, the deviation or deformation of the support pin 25 can be inhibited, thus making it possible to prevent the semiconductor chip 22 from being dislocated.

In the followings, the method of manufacturing a resin-molded type semiconductor device according to this invention will be explained.

Figure 50:
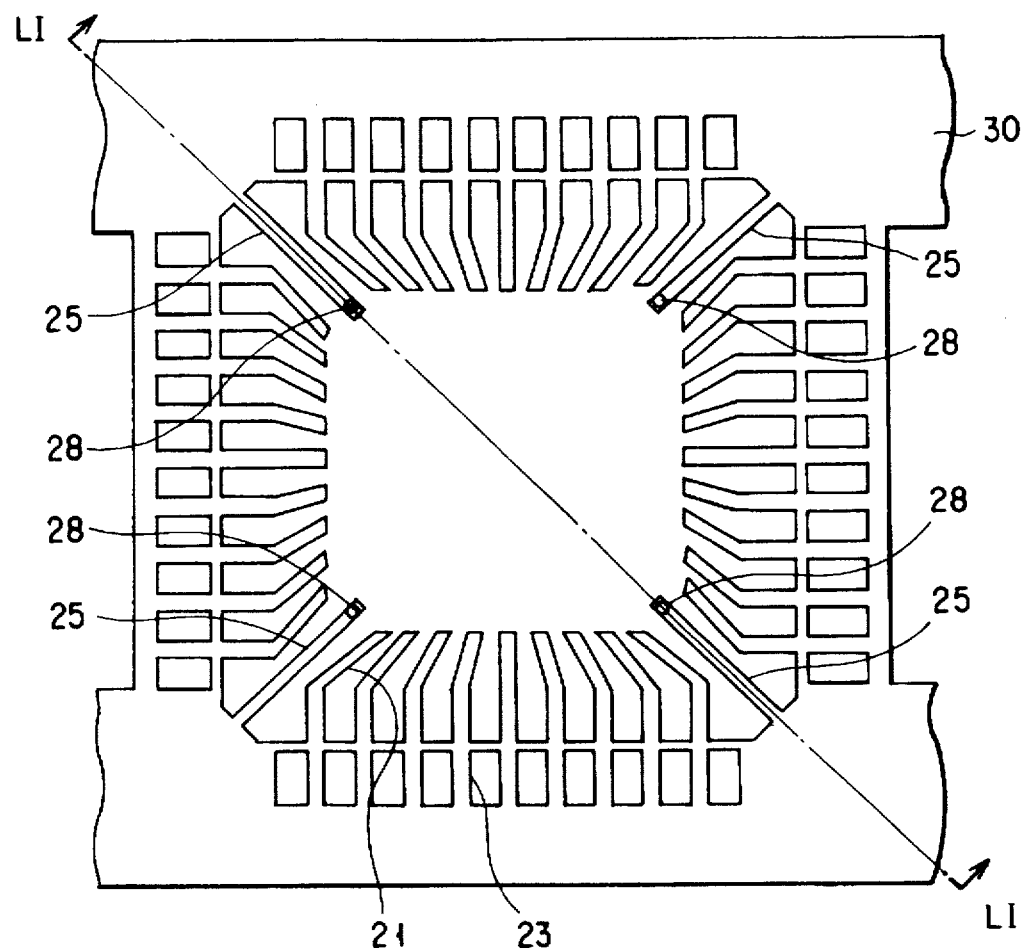
FIG. 50 is a plan view showing a manufacturing step of the resin-molded type semiconductor device of this invention.
Figure 51:
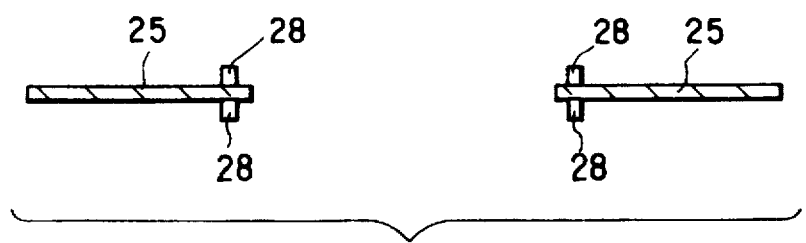
FIG. 51 is a cross-sectional view taken on line LI—LI of FIG. 50.

First of all, a lead frame as shown in FIGS. 50 and 51 is prepared. This lead frame comprises inner leads 21, outer leads 23, support pins 25, projected portions 28 and an outer frame 30. The projected portions 28 are disposed on the upper surface and the back surface of each support pin 25 respectively. The height of each projected portion 28 is the same with each other.

Then, as shown in FIGS. 52 and 53, a semiconductor chip 22 is mounted on a central space of the lead frame. Each space between the corner of the semiconductor chip 22 and the distal end portion of the support pin 25 is filled with an adhesive 26 so as to fix the semiconductor chip 22 in place by means of the support pins 25. A bonding wire 27 is disposed to effect a connection between each of the inner lead 21 and each corresponding electrode of the semiconductor chip 22.

Subsequently, the lead frame is placed in a cavity 33 of a mold 31 and fixed therein. At this occasion, the projected portion 28 mounted on the support pin 25 is fitted in the mold 31 with the distal end portion (the uppermost portion or the lowermost portion) of projected portion 28 being contacted or not contacted with the inner surface of the cavity 33.

Figure 54:
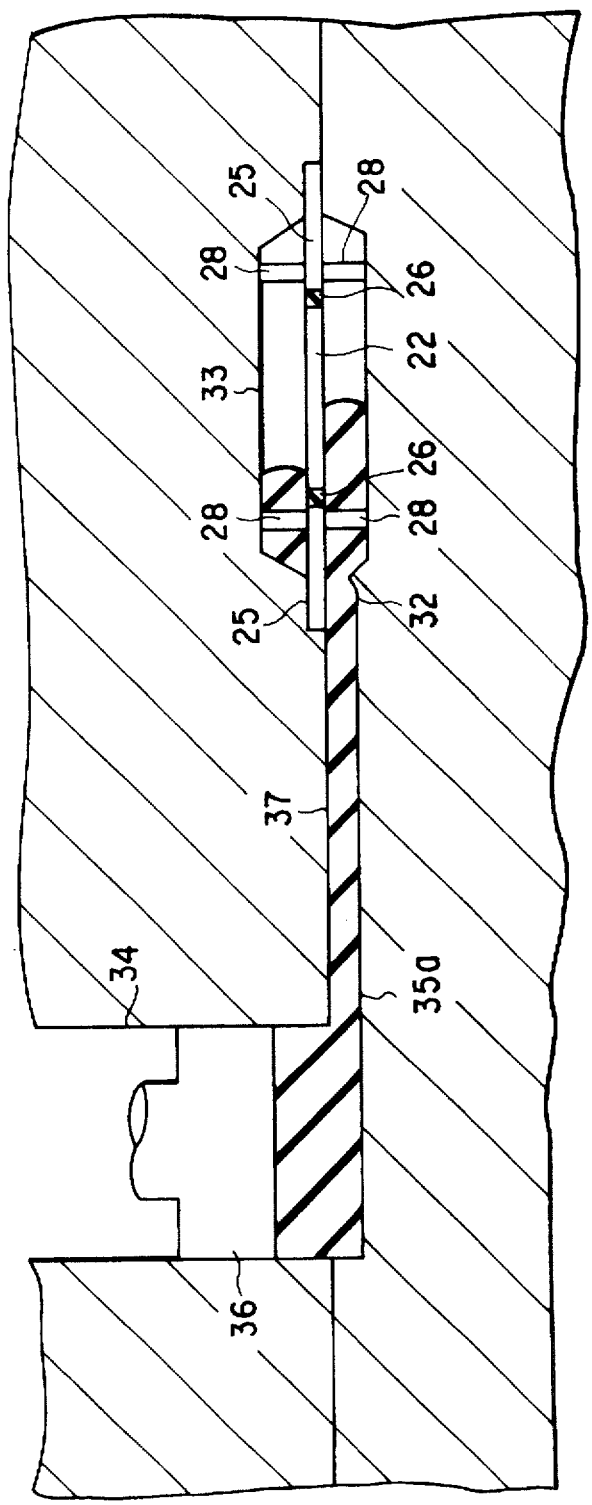
FIG. 54 is a plan view showing a manufacturing step of the resin-molded type semiconductor device of this invention.

Then, a resin tablet is charged into the pot 34 of the mold 31 as shown in FIG. 54. Subsequently, the resin tablet is compressed by a plunger 36 so as to allow the resin 35a to be transferred into the cavity 33 via a runner 37 and a gate 32. At this moment, even though the resin 35a is vigorously ejected into the cavity 33 from the gate 32, there is little possibility that the semiconductor chip 22 might be tilted or the support pin 25 might be bent, since the support pin 25 is firmly sustained by the projected portion 28.

Figure 55:
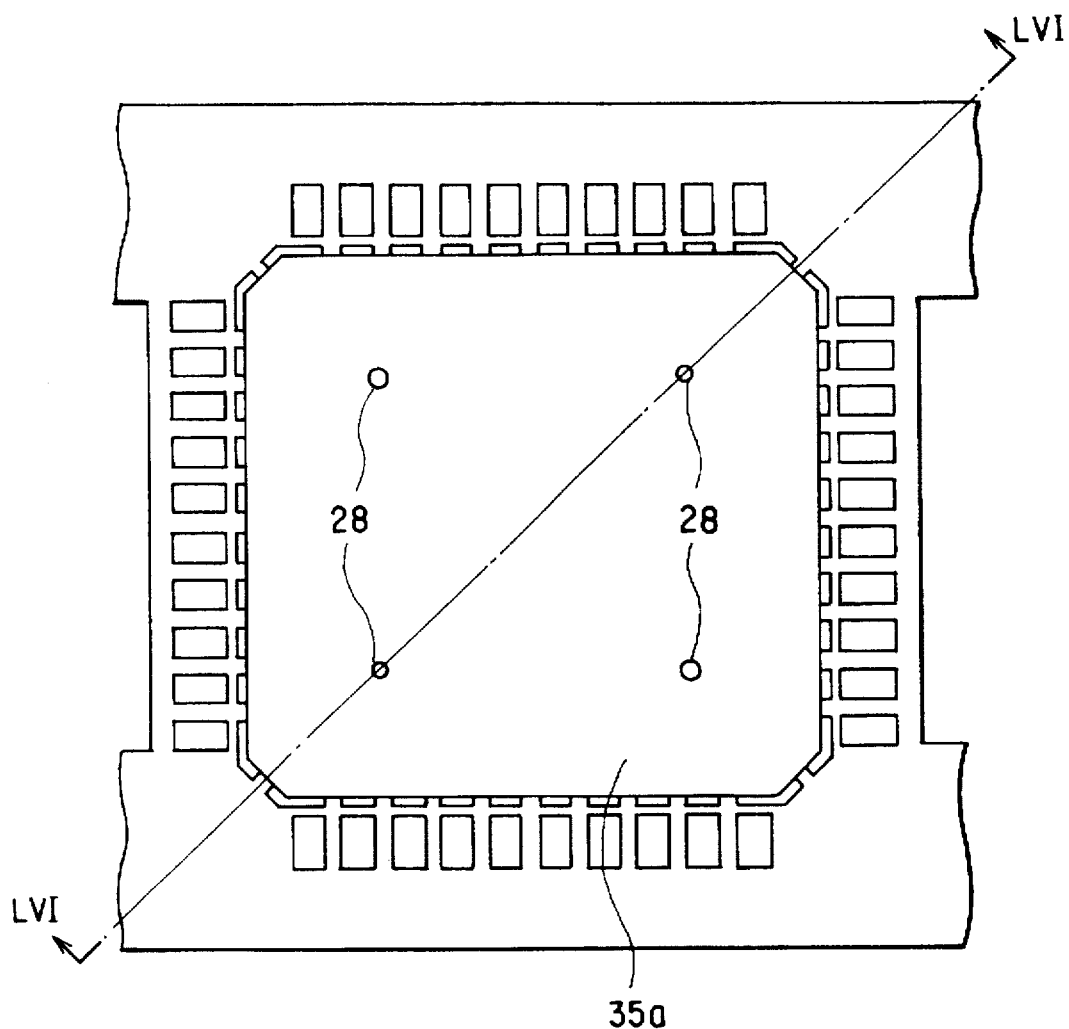
FIG. 55 is a plan view showing a manufacturing step of the resin-molded type semiconductor device of this invention.
Figure 56:
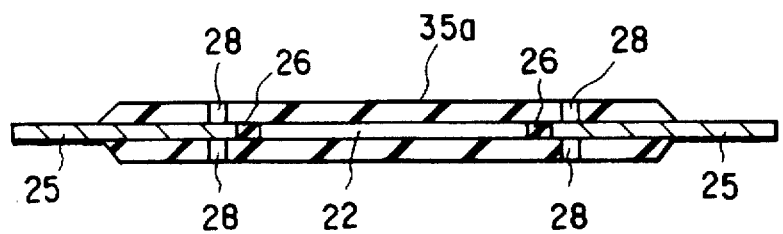
FIG. 56 is a cross-sectional view taken on line LVI—LVI of FIG. 55.

Then, as shown in FIGS. 55 and 56, after the resin 35a is cured, the lead frame is taken out of the mold 31. At this moment, the distal end of the projected portion 28 is flush with the surface of the resin 35a or buried in the resin 35a. When the height of the projected portions 28 are all set to the same level with each other, the thickness of the resin 35a disposed on the upper surface of the semiconductor chip becomes equal to the thickness of resin 35a disposed on the back surface of the semiconductor chip.

Then, as shown in FIGS. 57 and 58, the outer frame of the lead frame is cut off and the lead-forming is performed to accomplish the resin-molded type semiconductor device.

According to the aforementioned manufacturing method, even if the resin 35a is vigorously ejected into the cavity 33, there is little possibility that the support pin 25 might be caused to bend, since the support pin 25 is firmly sustained by the projected portion 28. Furthermore, since four corners of the semiconductor chip 22 are upheld by the support pins 25, the rotation or tilting of the semiconductor chip 22 can be prevented.

As a result, it is possible to prevent the semiconductor chip 22 from being exposed out of the resin 35a after the sealing with a resin. According to the aforementioned method of manufacturing semiconductor device, the object of this invention can be accomplished by merely forming the projected portion 28 on the support pin 25, thus the number of manufacturing steps would not be so increased and hence an increase in manufacturing cost can be inhibited.

Further, when all of the projected portions 28 are made equal in height so as to make the thickness of the resin 35a on both sides of the semiconductor chip 22 equal to each other, a package excellent in balance of thermal stress can be obtained so that the warping of the package can be substantially prevented.

Moreover, the thickness of the resin 35a on both sides of the semiconductor chip 22 can be suitably controlled by controlling the height of the projected portion 28.

It is also possible to make the thickness of the resin 35a on the upper surface of the semiconductor chip 22 different from the thickness of the resin 35a on the back surface of the semiconductor chip 22.

As explained above, the following various effects can be obtained by the aforementioned resin-molded type semiconductor device and by the aforementioned method of manufacturing the resin-molded type semiconductor device of this invention.

Namely, since a projected portion is formed on the support pin for upholding a semiconductor chip, the bending or deformation of the support pin in the process of resin-sealing through a transfer molding can be prevented, so that there is little possibility of the semiconductor chip being exposed out of the sealing resin even if the thickness of the package becomes very thin.

Since the support pins are disposed respectively to uphold the semiconductor chip by its two facing sides or two diagonally facing corners, the semiconductor chip can be firmly fixed in place. Further, when the semiconductor chip is upheld at the four sides or four corners thereof by respectively disposing the support pin, even the tilting of the semiconductor chip can be prevented.

When the projected portion is formed on each of the support pins disposed to uphold at least two facing sides or at least two diagonally facing corners of the semiconductor chip, the upward or downward displacement of the semiconductor chip within the sealing resin can be minimized. When a pair of the projected portions disposed on opposite sides of each of the support pins are positioned to overlap with each other as viewed from the upper side or bottom side of the semiconductor chip 22, any possibility of the supporting members (support pins) being bent can be minimized.

When the all of the projected portions are made equal in height, the thickness of the resin on both sides of the semiconductor chip becomes equal to each other, so that the warping of the package can be substantially prevented.

When the projected portion is formed on the distal end portion of the supporting member (support pin) in proximate to the semiconductor chip, the upward or downward displacement of the semiconductor chip within the sealing resin can be minimized.

When the height of the projected portion is smaller than the thickness of the supporting member (support pin), or when the height of the projected portion is smaller than the length or width of the projected portion, the strength of the projected portion becomes maximum, thus making it possible to prevent the projected portion from being fractured.

When the projected portion is to be formed in integral with the supporting member (support pin), the projected portion can be easily formed by bending projected portions or cut portions formed in advance in the raw material, thus saving the manufacturing cost thereof.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A resin sealed semiconductor device comprising:
    a semiconductor chip;
    a plurality of supporting members, each having an upper surface, a lower surface and a distal end portion for supporting the semiconductor chip;
    an adhesive disposed between the distal end portions of said supporting members and a peripheral portion of said semiconductor chip;
    a plurality of leads;
    bonding wires for connecting the plurality of leads to electrodes of the semiconductor chip;
    a projected portion projecting from the upper surface and a projecting portion projecting from the lower surface of at least one of said plurality of supporting members; and
    a sealing resin covering said semiconductor chip.

2. The resin sealed semiconductor device according to claim 1, wherein said plurality of supporting members support a pair of opposite sides of the semiconductor chip.

3. The resin sealed semiconductor device according to claim 1, wherein said plurality of supporting members support a pair of diagonally opposed corners of the semiconductor chip.

4. The resin sealed semiconductor device according to claim 1, wherein said plurality of supporting members are formed only within an interior of the resin.

5. The resin sealed semiconductor device according to claim 1, wherein said plurality of supporting members protrude out of the resin.

6. The resin sealed semiconductor device according to claim 2, wherein said projected portions are formed on the supporting members supporting the pair of opposite sides of the semiconductor chip.

7. The resin sealed semiconductor device according to claim 3, wherein said projected portions are formed on the supporting members supporting the pair of diagonally opposed corners of the semiconductor chip.

8. The resin sealed semiconductor device according to claim 1, wherein said projected portions are formed on each of the plurality of supporting members.

9. The resin sealed semiconductor device according to claim 1, wherein said projected portions overlap each other when viewed from an upper side of the semiconductor chip.

10. The resin sealed semiconductor device according to claim 1, wherein said projected portions have substantially the same height.

11. The resin sealed semiconductor device according to claim 1, wherein a thickness of the sealing resin formed on an upper side of the semiconductor chip has substantially the same thickness as the resin formed on lower side of the semiconductor chip.

12. The resin sealed semiconductor device according to claim 1, wherein said projected portions are disposed at the distal end portion of the at least one supporting member.

13. The resin sealed semiconductor device according to claim 1, wherein said projected portions are disposed only within the sealing resin.

14. The resin sealed semiconductor device according to claim 1, wherein said projected portions have a height larger than a thickness of the at least one supporting member.

15. The resin sealed semiconductor device according to claim 1, wherein said projected portions have a height smaller than a thickness of the at least one supporting member.

16. The resin sealed semiconductor device according to claim 1, wherein said projected portions have a height smaller than a length or width of the projected portions.

17. The resin sealed semiconductor device according to claim 1, wherein said semiconductor chip has a thickness larger than a thickness of said leads.

18. The resin sealed semiconductor device according to claim 1, wherein said semiconductor chip has a thickness that is substantially equal to a thickness of said leads.

19. The resin sealed semiconductor device according to claim 1, wherein said projected portions are integrally formed with the at least one supporting member.

20. The resin sealed semiconductor device according to claim 1, wherein said projected portion that projects from the upper surface extends upwardly and wherein said projected portion that projects from the lower surface projects downwardly from the at least one supporting member.

21. The resin sealed semiconductor device according to claim 20, wherein said adhesive and said projected portions comprise a conductive material.

22. The resin sealed semiconductor device according to claim 20, wherein said adhesive and said projected portions comprise an insulating material.

23. The resin sealed semiconductor device according to claim 20, wherein said adhesive comprises a conductive material and said projected portions comprise an insulating material.

24. The resin sealed semiconductor device according to claim 20, wherein said adhesive comprises an insulating material and said projected portions comprise a conductive material.

25. The resin sealed semiconductor device according to claim 1, wherein said projected portions have a columnar shape.

26. The resin sealed semiconductor device according to claim 1, wherein said projected portions have a pyramidal shape.

27. The resin sealed semiconductor device according to claim 1, further comprising a bonding wire for connecting an electrode of said semiconductor chip to the distal end portion of said supporting members.

* * * * *